(12) United States Patent
Seo et al.

(10) Patent No.: US 9,431,614 B2
(45) Date of Patent: Aug. 30, 2016

(54) ORGANIC LIGHT EMITTING DEVICE

(71) Applicant: LG DISPLAY CO., LTD., Seoul (KR)

(72) Inventors: Jeong-Dae Seo, Incheon (KR);
Chang-Wook Han, Seoul (KR);
Yoon-Heung Tak, Goyang-si (KR);
Hyo-Seok Kim, Goyang-si (KR);
Eun-Ju Jeon, Icheon-si (KR);
Hye-Seung Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 805 days.

(21) Appl. No.: 13/683,471

(22) Filed: Nov. 21, 2012

(65) Prior Publication Data

US 2013/0153867 A1    Jun. 20, 2013

(30) Foreign Application Priority Data

Dec. 16, 2011  (KR) .......................... 10-2011-0136862

(51) Int. Cl.
*H01L 51/54*      (2006.01)
*H01L 51/00*      (2006.01)
(Continued)

(52) U.S. Cl.
CPC ......... *H01L 51/0054* (2013.01); *H01L 51/006* (2013.01); *H01L 51/5278* (2013.01); *H01L51/0067* (2013.01); *H01L 51/0081* (2013.01); *H01L 51/0085* (2013.01); *H01L 51/5048* (2013.01)

(58) Field of Classification Search
CPC ............. H01L 51/0054; H01L 51/006; H01L 51/0067; H01L 51/0081; H01L 51/0085; H01L 51/5048; H01L 51/5278
See application file for complete search history.

(56) References Cited

U.S. PATENT DOCUMENTS

2003/0118866 A1* 6/2003 Oh et al. ........................ 428/690
2006/0240278 A1* 10/2006 Hatwar et al. ................. 428/690

(Continued)

FOREIGN PATENT DOCUMENTS

CN    101268167 A    9/2008
CN    102067730 A    5/2011
(Continued)

*Primary Examiner* — Dawn Garrett
(74) *Attorney, Agent, or Firm* — Birch, Stewart, Kolasch & Birch, LLP

(57) ABSTRACT

Discussed is an organic light emitting device that exhibits improved efficiency and driving voltage by applying a novel material facilitating charge generation to a charge generation layer. The charge generation layer contains a compound represented by the following formulae:

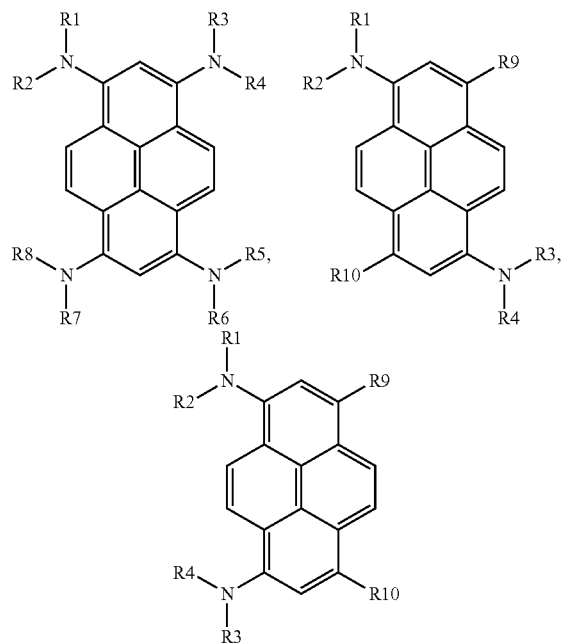

wherein R1, R2, R3, R4, R5, R6, R7 and R8 are optionally substituted and are independently selected from an aromatic group having 6 to 20 carbon atoms, and R9 and R10 are independently selected from hydrogen, an optionally substituted aromatic ring having 6 to 20 carbon atoms and an optionally substituted heterocyclic compound having 3 to 17 carbon atoms and one or more elements of N, S and P.

17 Claims, 11 Drawing Sheets

| Cathode (200) |
| --- |
| n$^{th}$ Stack (110n) |
| ⋮ |
| 2$^{nd}$ CGL (120b) |
| 2$^{nd}$ Stack (110b) |
| 1$^{st}$ CGL (120a) |
| 1$^{st}$ Stack (110a) |
| Anode (100) |

(51) Int. Cl.
*H01L 51/52* (2006.01)
*H01L 51/50* (2006.01)

(56) References Cited

U.S. PATENT DOCUMENTS

| | | |
|---|---|---|
| 2007/0046189 A1 | 3/2007 | Hatwar et al. |
| 2010/0295030 A1* | 11/2010 | Kawamura ............... 257/40 |
| 2011/0079774 A1* | 4/2011 | Kang et al. ............... 257/40 |
| 2012/0168725 A1* | 7/2012 | Lin et al. ............... 257/40 |

FOREIGN PATENT DOCUMENTS

| | | |
|---|---|---|
| JP | 10-088122 A | 4/1998 |
| KR | 10-2009-0119746 A | 11/2009 |
| KR | 10-2011-0002155 A | 1/2011 |

* cited by examiner

CH-01

CH-02

CH-03

CH-04

FIG. 3 (cont...)
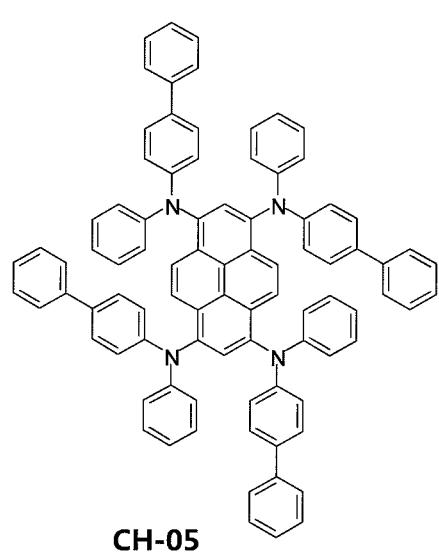
CH-05
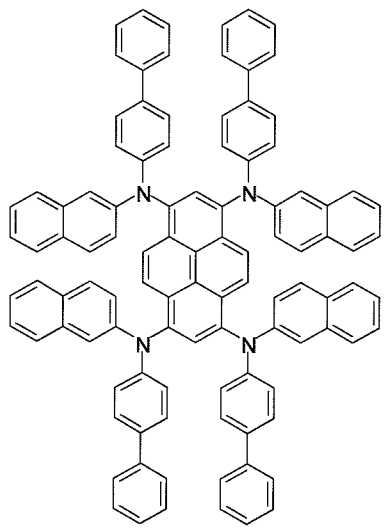
CH-06
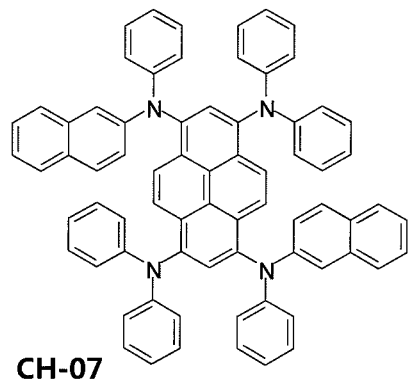
CH-07
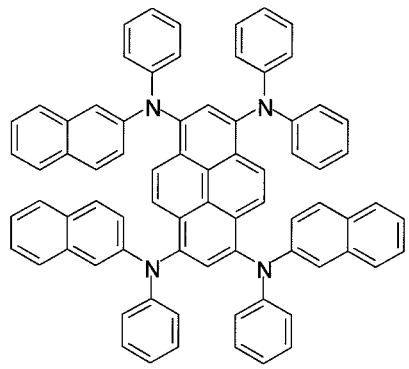
CH-08
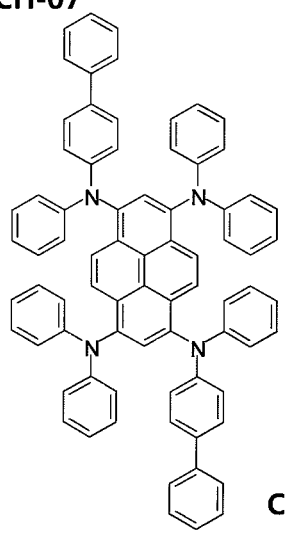
CH-09

CH-10

CH-11

CH-12

CH-13

CH-14

CH-15

FIG. 4 (cont...)
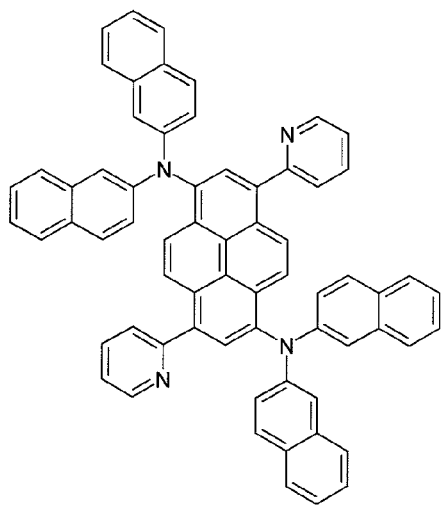
CH-16
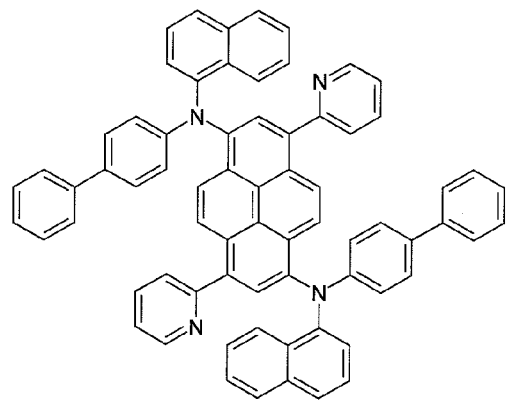
CH-17

CH-18

CH-19

CH-20

CH-21

CH-22  CH-23

CH-24  CH-25

FIG. 6 (cont...)
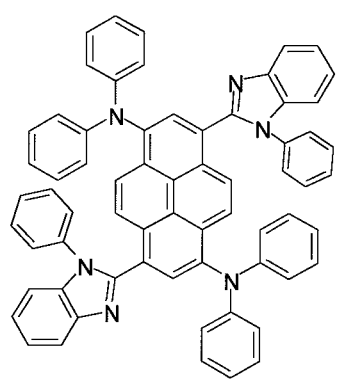
CH-26
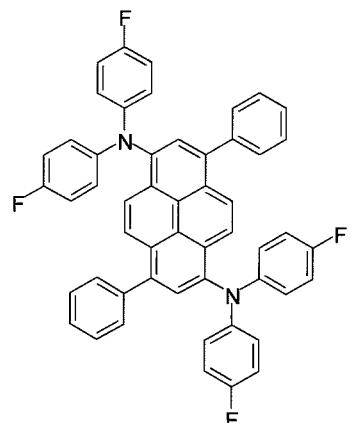
CH-27
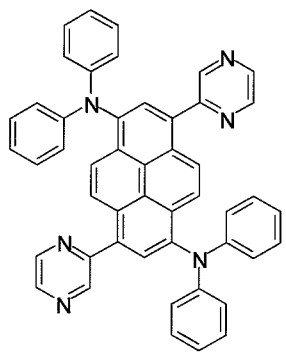
CH-28
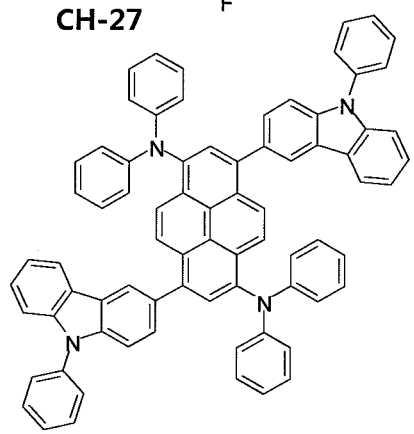
CH-29
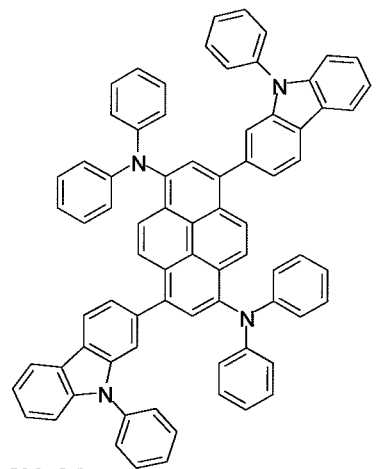
CH-30
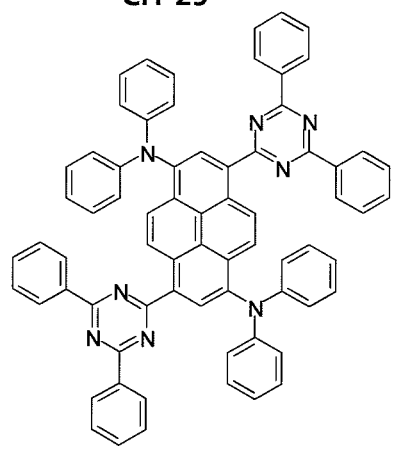
CH-31

FIG. 6 (cont...)
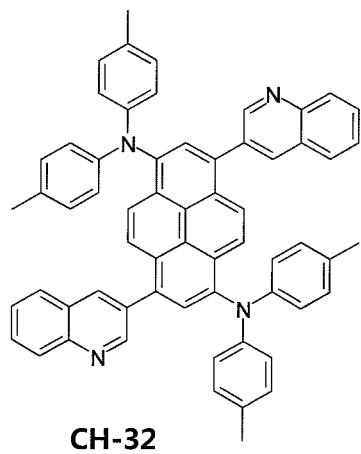
CH-32
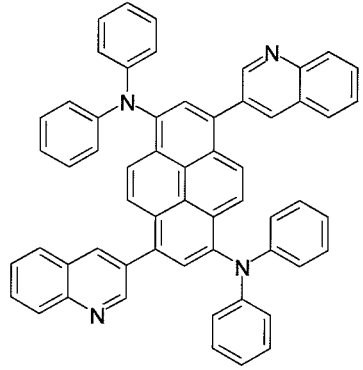
CH-33
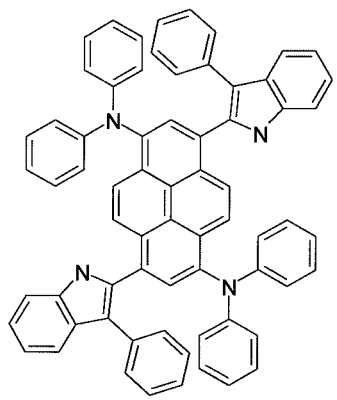
CH-34
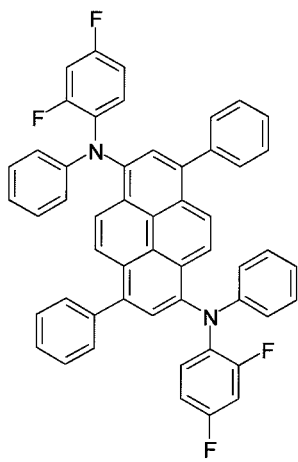
CH-35
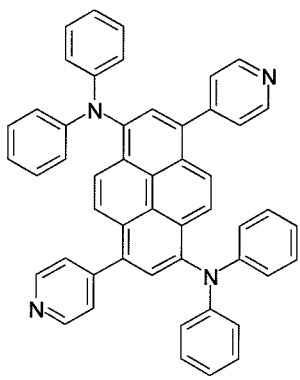
CH-36

ORGANIC LIGHT EMITTING DEVICE

This application claims the priority benefit of Korean Patent Application No. 10-2011-0136862, filed on Dec. 16, 2011, which is hereby incorporated by reference as if fully set forth herein.

BACKGROUND OF THE INVENTION

1. Field of the Invention

The present invention relates to an organic light emitting device. More specifically, the present invention relates to a white organic light emitting device in which efficiency is improved by specifying an energy level of a hole transport layer or a blocking layer adjacent to a light emitting layer.

2. Discussion of the Related Art

The recent trend toward information-dependent age has brought about rapid development in display fields that visually display electrical information signals. In this regard, a variety of flat display devices having superior properties such as slimness, low weight and low power consumption are developed and are actively used as substitutes for conventional cathode ray tubes (CRTs).

Specific examples of flat display devices include liquid crystal display devices (LCDs), plasma display panel devices (PDPs), field emission display devices (FEDs), organic light emitting devices (OLEDs) and the like.

Among these, organic light emitting devices that do not require an additional light source, have a compact design and give clear color are considered to be competitive in the flat display device market.

Organic light emitting display devices require the formation of organic light emitting layers. The formation of organic light emitting layers is generally carried out by a deposition method using a shadow mask.

However, shadow masks which cover a large area may be bent due to load. For this reason, it is impossible to use the large-area shadow mask several times, and defects associated with pattern formation of organic light emitting layers occur. Accordingly, there is a demand for an alternative method.

A tandem organic light emitting device (hereinafter, referred to as "tandem organic light emitting device") suggested as an alternative to the shadow mask organic light emitting device will be described below.

The tandem organic light emitting device is characterized in that respective light emitting diode layers interposed between an anode and a cathode are deposited without using a mask, and organic films including the organic light emitting layers are sequentially deposited under vacuum using different materials.

Meanwhile, realization of white light using a tandem organic light emitting device may be performed by mixing light emitted from two or more light emitting layers. In this case, the tandem organic light emitting device includes a plurality of light emitting layers that emit light with different colors that are interposed between an anode and a cathode, and a charge generation layer (CGL) provided between respective light emitting layers. Stacks are separated, based on each light emitting layer.

In such a tandem organic light emitting device, one material does not emit light and a plurality of light emitting layers containing light emitting materials having different photoluminescence peaks (PL peaks) at respective wavelengths emit light at different positions of the device and the light is combined and emitted.

The tandem organic light emitting device includes a charge generation layer between the different stacks. This charge generation layer transports electrons or holes to an adjacent stack. HAT-CN or $MoO_3$ can be used as a material for the charge generation layer.

However, conventional tandem organic light emitting devices have the following problems.

The tandem device includes a charge generation layer between different stacks. These charge generation layers transport electrons or holes to an adjacent stack. In this regard, when a charge generation layer is formed using the material commonly used for the tandem device, transport of electrons or holes between the adjacent stack and the charge generation layer may be impossible due to bad interface properties of the stacks adjacent to the charge generation layer. In this case, emission of light may normally occur in the adjacent phosphorescent or fluorescent stack. Accordingly, problems such as deterioration of driving voltage and decrease in efficiency may occur. As a result, the lifespan of the tandem organic light emitting device is deteriorated.

Given the foregoing, a great deal of research to find factors that block injection of holes or electrons into the charge generation layer is underway. Recently, research to solve these problems by changing materials for the charge generation layer has been started.

SUMMARY OF THE INVENTION

Accordingly, the present invention is directed to an organic light emitting device that substantially obviates one or more problems due to limitations and disadvantages of the related art.

It is one object of the present invention to provide an organic light emitting device that exhibits improved efficiency and driving voltage by applying a novel material facilitating charge generation to a charge generation layer.

In accordance with one aspect of the present invention, provided is an organic light emitting device comprising: a first electrode and a second electrode opposing each other; a plurality of stacks interposed between the first electrode and the second electrode, each stack comprising a light emitting layer; and a charge generation layer to connect the adjacent stacks, wherein the charge generation layer at least comprises a first organic substance having an electron-withdrawing substituent and a second organic substance capable of injecting holes.

The first organic substance may have one or more electron withdrawing substituents as discussed in Morrison et al., Organic Chemistry, $4^{th}$ Ed., 1983, pages 612-613, Allyn and Bacon Inc. Examples include CN, $NO_2$ and F. The second organic substance may have a fused aromatic group having tertiary amine as a substituent. Preferably, this second organic substance has a pyrene core with two or four tertiary amine substituents.

In accordance with another aspect of the present invention, provided is an organic light emitting device comprising: a first electrode and a second electrode opposing each other; a plurality of stacks interposed between the first electrode and the second electrode, each stack comprising a light emitting layer; and a charge generation layer to connect the adjacent stacks, wherein the organic light emitting device comprises at least one compound represented by the following Formulae 1 to 3:

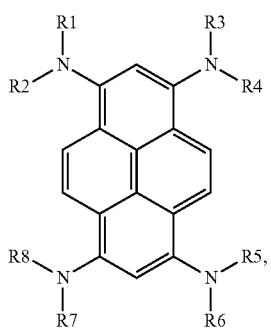

[Formula 1]

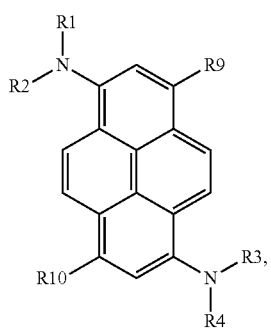

[Formula 2]

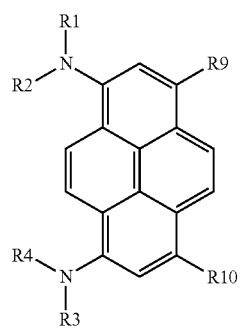

[Formula 3]

wherein R1, R2, R3, R4, R5, R6, R7 and R8 are optionally substituted and are independently selected from an aromatic group having 6 to 20 carbon atoms, and R9 and R10 are independently selected from the group consisting of hydrogen, an optionally substituted aromatic ring having 6 to 20 carbon atoms, and an optionally substituted heterocyclic compound having 3 to 17 carbon atoms and one or more elements of N, S and P.

Each of R1 to R10 may independently be substituted by an alkyl group, an aromatic ring having 6 to 20 carbon atoms, or a halogen. Preferably, the alkyl group has 1 to 6 carbon atoms.

Also, the halogen is preferably F, Cl, Br or I.

The volume of the at least one of the compounds of Formulae 1 to 3 contained in the charge generation layer is preferably about 20 to 60%—based on the total volume of organic substances constituting the charge generation layer. In addition, the volume of the first organic substance having an electron withdrawing substituent is preferably about 80 to 40% based on the total volume of organic substances constituting the charge generation layer.

The charge generation layer can be any thickness so long as it can satisfactorily retain its properties, but preferably this charge generation layer has a thickness of 75 Å to 250 Å.

The charge generation layer may further contain an organic substance capable of generating charges. In this case, the organic substance capable of generating charges may be HAT-CN.

The stack may include a first common layer and a second common layer provided on and under the light emitting layer, respectively, and the second common layer adjacent to the charge generation layer may further include an n-type organic layer to facilitate injection of electrons from the charge generation layer.

If necessary, the first common layer of the stack may contain at least one compound represented by Formulae 1 to 3.

Also, in the organic light emitting device including a hole injection layer, a hole transport layer, a light emitting layer and an electron transport layer interposed between a first electrode and a second electrode, the compound of the present invention may be used as a material for the hole transport layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings.

DETAILED DESCRIPTION OF THE INVENTION

Reference will now be made in detail to the specific embodiments of the present invention, examples of which are illustrated in the accompanying drawings.

Hereinafter, an organic light emitting device according to the present invention will be described in detail with reference to the accompanying drawings.

Figure 1:
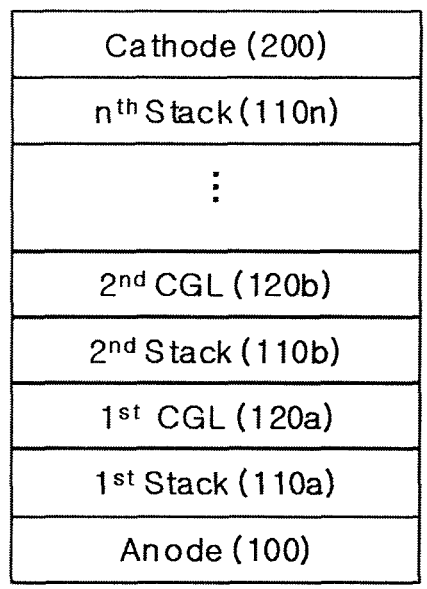
FIG. 1 is a sectional view illustrating a tandem organic light emitting device according to the present invention.
Figure 2:
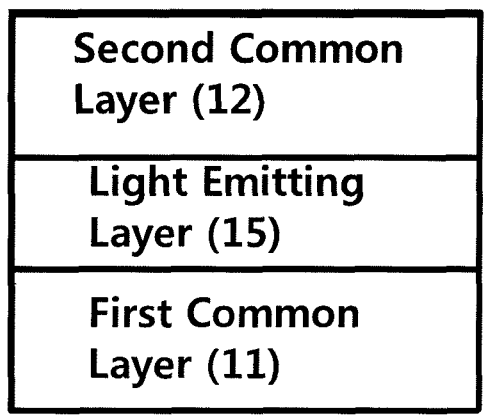
FIG. 2 is a sectional view illustrating one stack of the device of FIG. 1.

FIG. 1 is a sectional view illustrating a tandem organic light emitting device according to the present invention. FIG. 2 is a sectional view illustrating one stack of the device of FIG. 1.

As shown in FIG. 1, the tandem organic light emitting device according to the present invention includes a first electrode 100 and a second electrode 200 opposing each other, a plurality of stacks (110a, 110b, 110n) interposed between the first electrode 100 and the second electrode 200, and charge generation layers (120a, 120b, . . . ) interposed between the adjacent stacks (110a, 110b, . . . , 110n).

Also, as shown in FIG. 1, the first electrode 100 and the second electrode 200 may be an anode and a cathode, respectively. Conversely, the first electrode 100 may be a cathode and the second electrode 200 may be an anode. A substrate (not shown) provided with a thin film transistor array is disposed under the first electrode 100 and a thin film transistor formed in one pixel of the thin film transistor array is connected to the first electrode 100.

In a tandem organic light emitting device, the stacks are at least two, and a charge generation layer is interposed between the stacks to increase the number of stacks.

As shown in FIG. 2, each stack includes a light emitting layer 15 disposed in the center thereof, a first common layer 11 disposed under the light emitting layer 15, and a second common layer 12 disposed on the light emitting layer 15.

Also, the first common layer 11 may include a hole injection layer and/or a hole transport layer, and the second common layer 12 may include an electron transport layer and/or an electron injection layer. Also, each of the hole injection layers and the hole transport layer may be provided as a single layer or include a plurality of layers. Similarly, each of the electron transport layer and the electron injection layer may be provided as a single layer or include a plurality of layers.

Also, the electron injection layer included in the second common layer 12 may have a configuration in which an n-type organic semiconductor layer is adjacent to the charge generation layer, to improve injection efficiency of electrons transported from the charge generation layer.

Meanwhile, respective stacks include light emitting layers that emit light with different colors. For example, a first stack including a blue light emitting layer and a second stack including a yellowish green, yellow or red/green light emitting layer are laminated to realize a tandem white organic light emitting device. Also, in such a tandem white organic light emitting device, each of the first stack and the second stack has a laminate structure including a first common layer (hole injection layer or hole transport layer), a light emitting layer, and a second common layer (electron transport layer or electron injection layer).

The charge generation layer (CGL) to connect two adjacent stacks contains organic and inorganic substances capable of generating charges and an organic substance that facilitates charge generation.

For example, a material for the charge generation layer, HAT-CN can be singly used or MoO3 as an inorganic substance is doped in NPD. However, these materials have problems of increase in driving voltage and decrease in lifespan due to poor properties of the interface between stacks adjacent to the charge generation layer.

The tandem organic light emitting device according to the present invention contains an organic substance that facilitates charge generation and the charge generation layer at least contains a first organic substance having an electron-withdrawing substituent and a second organic substance capable of injecting holes.

The first organic substance has one or more electron withdrawing substituents, which are preferably CN, $NO_2$ and F, and the second organic substance has a fused aromatic group for a core, and has tertiary amine substituents.

Also, the second organic substance is selected from the following Formulae 1, 2 and 3.

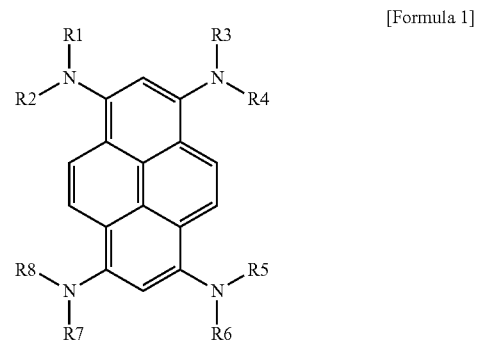

[Formula 1]

wherein R1, R2, R3, R4, R5, R6, R7 and R8 are independently selected from an aromatic group having 6 to 20 carbon atoms.

Examples of "an aromatic group having 6 to 20 carbon atoms" include phenyl, naphthalene, azulene, phenanthrene, anthracene, triphenylene, pyrene, chrysene, and naphthacene.

Also, the aromatic group having 6 to 20 carbon atoms of R1 to R8 may be substituted by an alkyl group, an aromatic group having 6 to 20 carbon atoms, or a halogen. The alkyl group substituent may be bonded to the aromatic group having 6 to 20 carbon atoms of R1 to R8 at both ends of the alkyl group in such a manner as to form a ring. The alkyl group preferably has one to six carbon atoms. Also, the halogen is preferably F, Cl, Br or I.

Examples of "an alkyl group" include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, and n-decyl.

Figure 3:
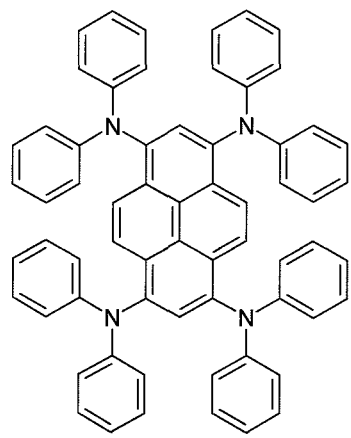
FIG. 3 illustrates compounds represented by Formula 1, contained in a charge generation layer of the present invention.
Figure 3:
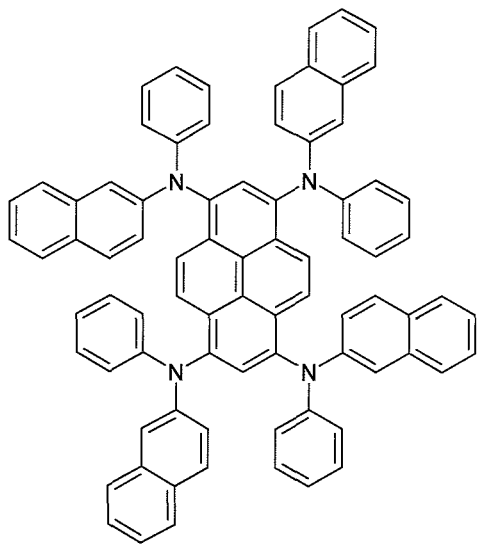
Figure 3:
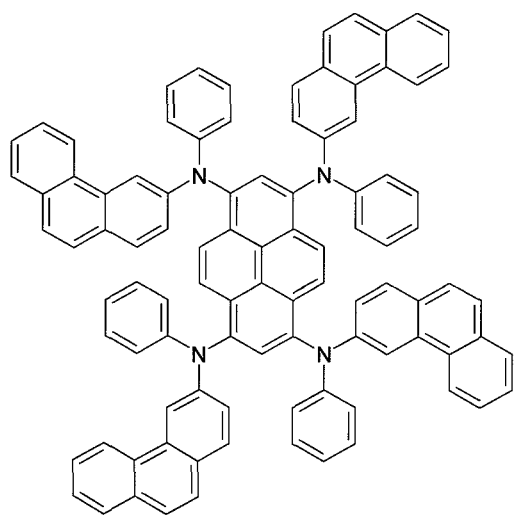
Figure 3:
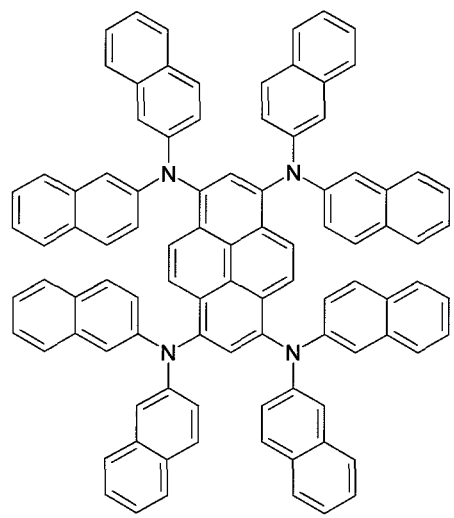

FIG. 3 illustrates compounds represented by Formula 1, contained in the charge generation layer of the present invention.

As shown in FIG. 3, the compounds represented by Formula 1 are CH-01 to CH-09. However, the illustrated examples are only provided as limited examples of the aromatic ring by which R1 to R8 may be substituted, and the compounds may be substituted in various forms within the scope of 6 to 20 carbon atoms.

The compounds CH-01 to CH-09 are as follows:

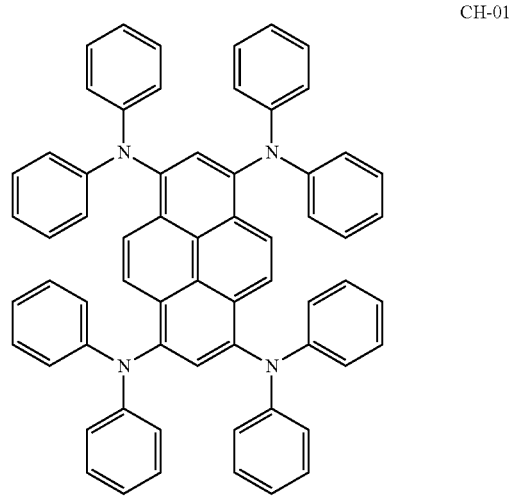

CH-01

CH-02
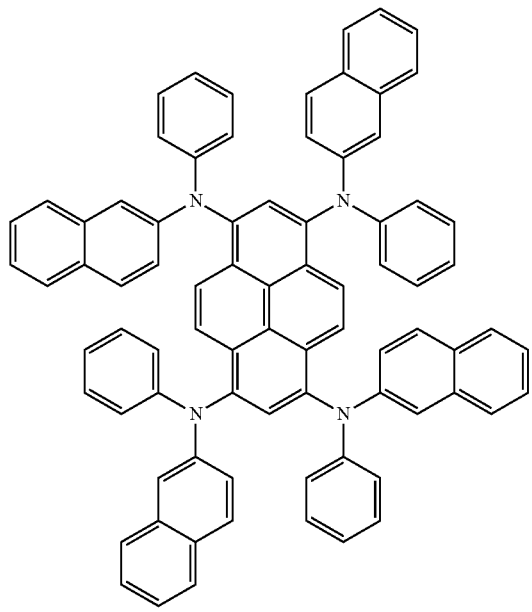
CH-04
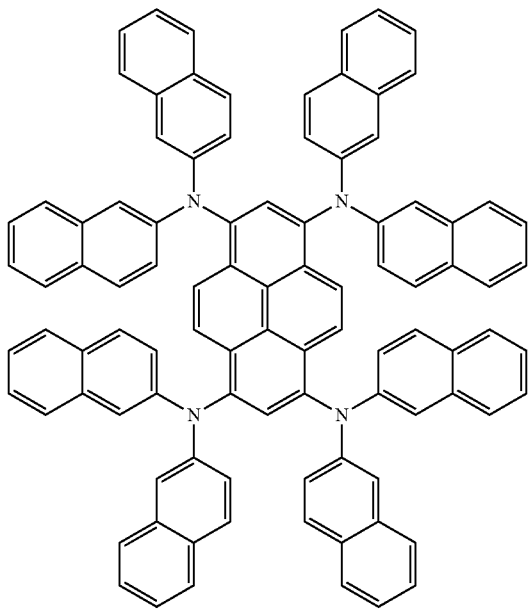
CH-03
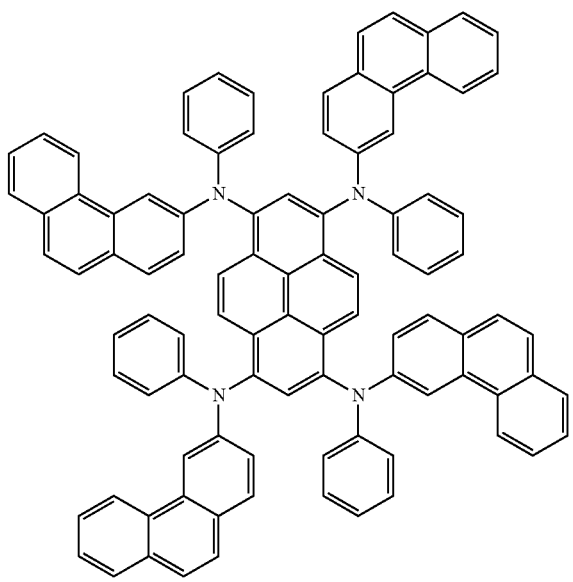
CH-05
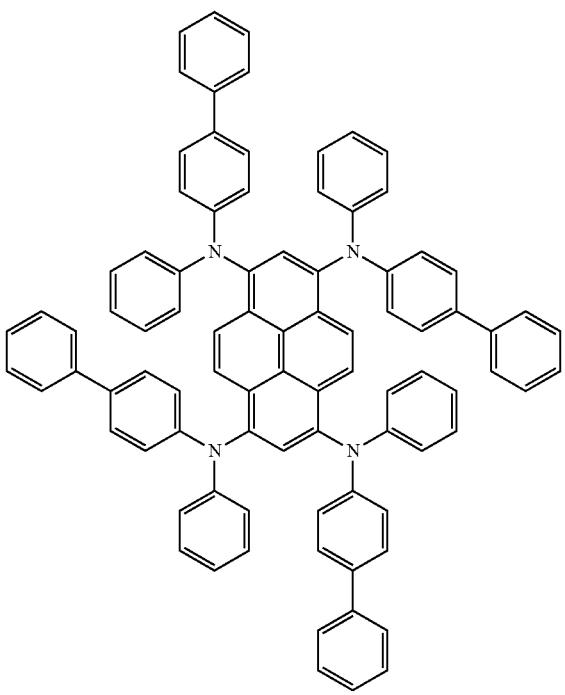

CH-06
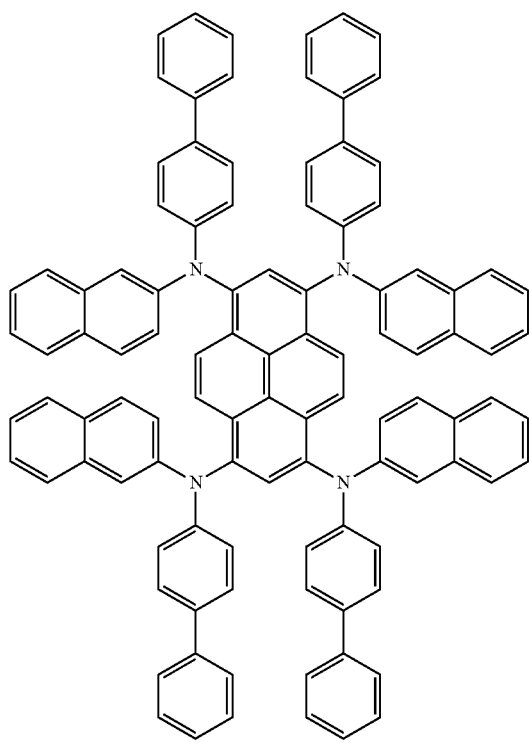
CH-07
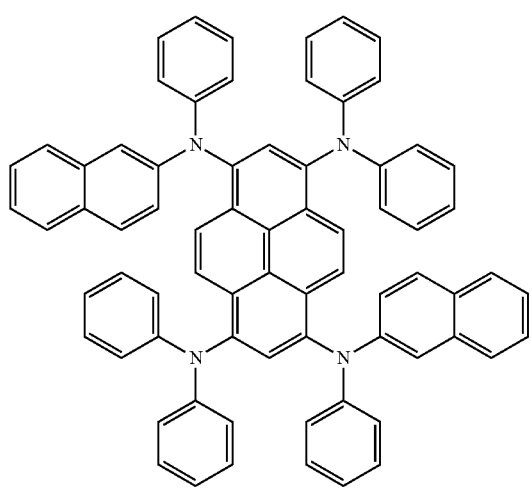
CH-08
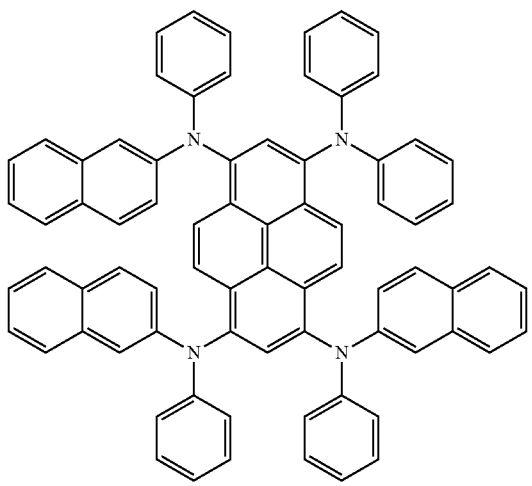
CH-09
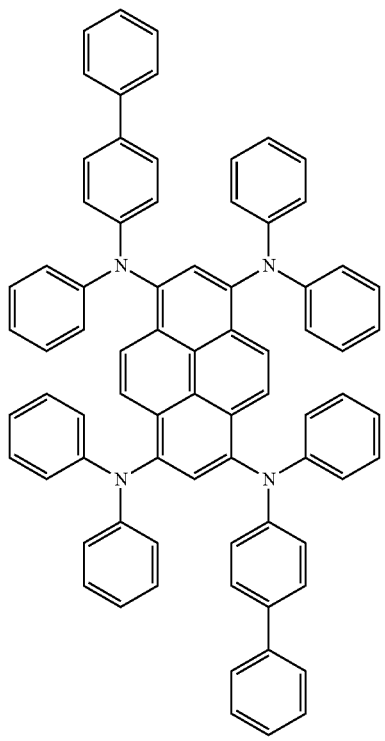
[Formula 2]
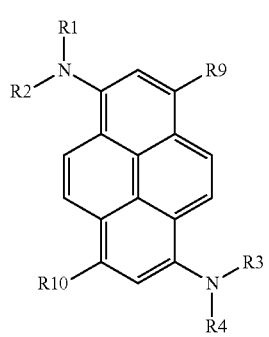

wherein R1, R2, R3 and R4 have the same definition as in Formula 1, R9 and R10 are independently selected from the group consisting of hydrogen, an aromatic ring having 6 to 20 carbon atoms, and a heterocyclic compound having 3 to 17 carbon atoms and one or more elements of N, S and P.

R9 and R10 may be substituted with the same substituents as discussed above for R1 to R8. Examples of the heterocyclic compound include, but are not limited to pyrrolizine, indene, indole, isoindole, benzofuran, isobenzofuran, benzimidazole, 1,2-benzisoxazole, benzoxazole, benzothiazole, quinoline, isoquinoline, quinolizine, quinazoline, indazole, quinoxaline, carbazole, dibenzofuran, acridine, pyrrole, pyrrolidine, pyrazole, imidazole, furan, isoxazole, oxazole, thiophene, thiazole, piperidine, pyridine, pyridazine, pyrimidine, pyrazine, piperazine, 1,3,5-triazine, pyran, 1,4-dioxane, 1,3-dioxane, morpholine, azepine and pipecoline.

Figure 4:
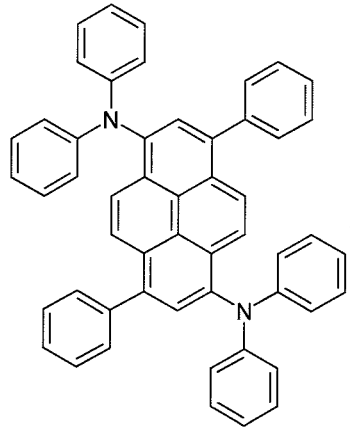
FIG. 4 illustrates compounds represented by Formula 2, contained in the charge generation layer of the present invention.
Figure 4:
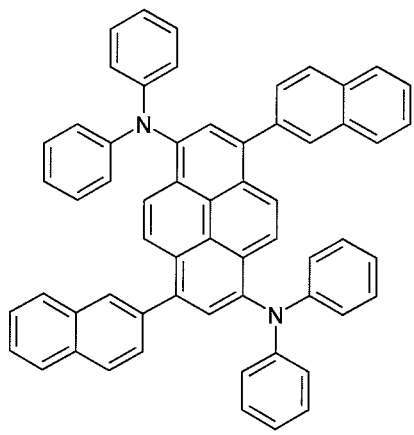
Figure 4:
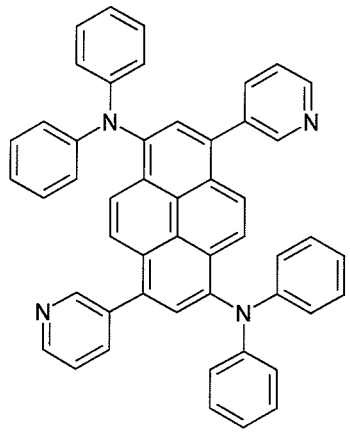
Figure 4:
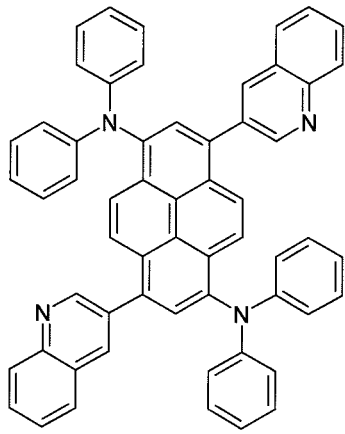
Figure 4:
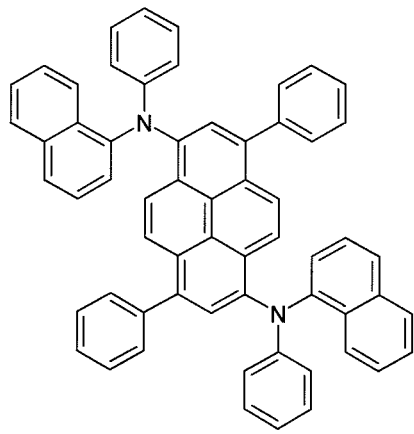
Figure 4:
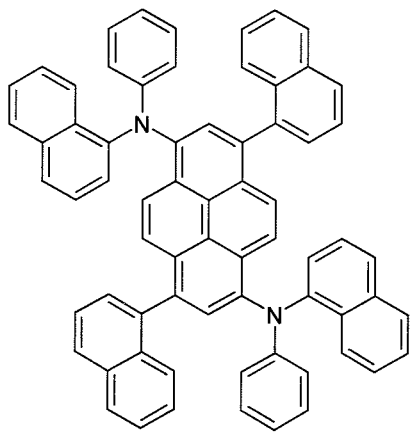

FIG. 4 illustrates compounds represented by Formula 2, contained in the charge generation layer of the present invention.

As shown in FIG. 4, the compounds represented by Formula 2 are CH-10 to CH-17. However, the illustrated examples are only provided as limited examples of the aromatic ring by which R1 to R4 may be substituted and as limited examples of the aromatic ring or heterocyclic compound by which R9 and R10 may be substituted, and the compounds may be substituted in various forms under the conditions as described above associated with Formula 2.

The compounds CH-10 to CH-17 are as follows:

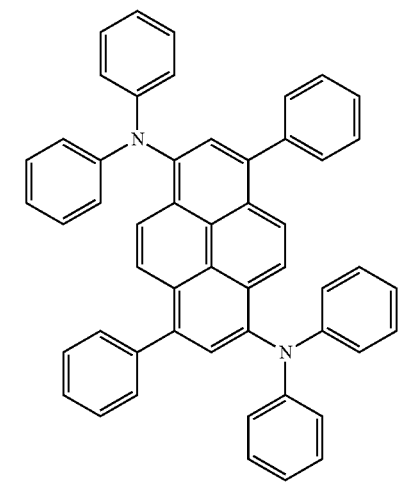

CH-10

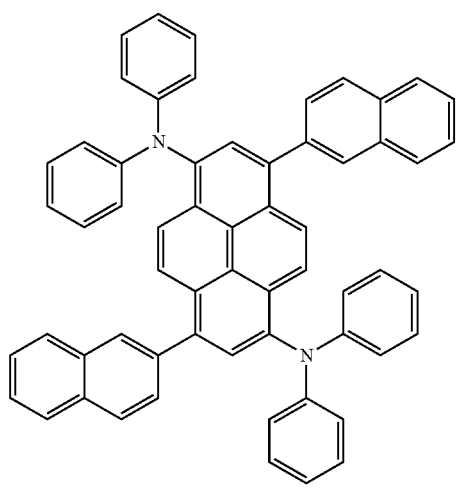

CH-11

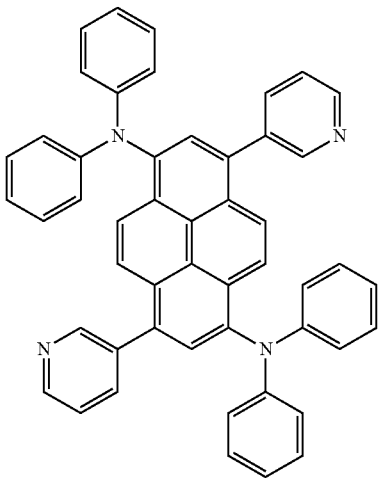

CH-12

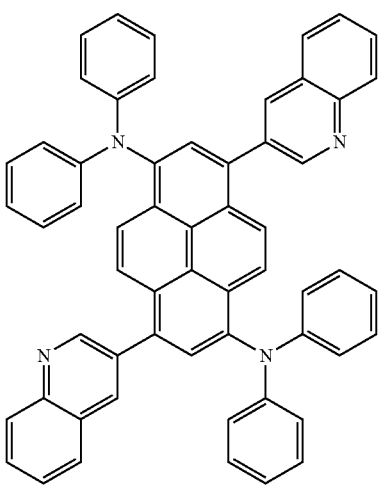

CH-13

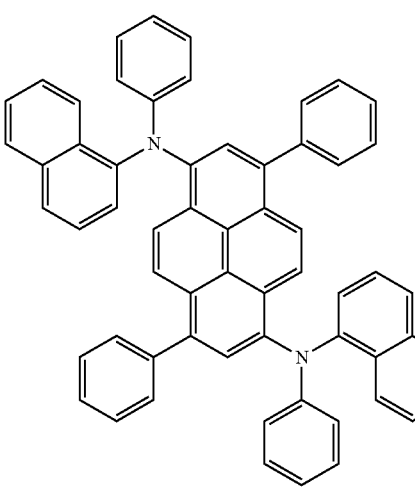

CH-14

CH-15

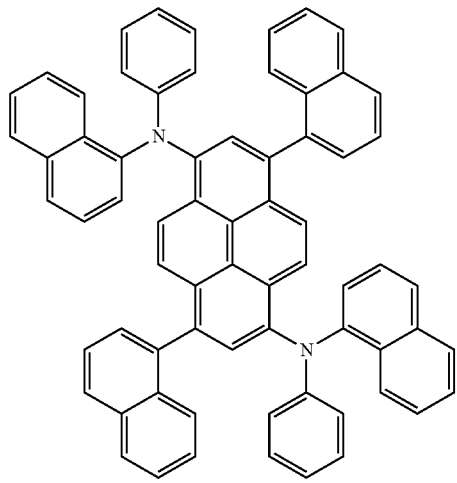

CH-16

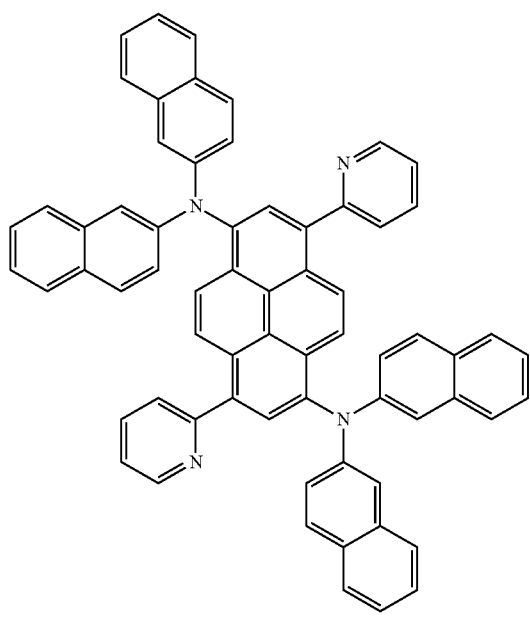

CH-17

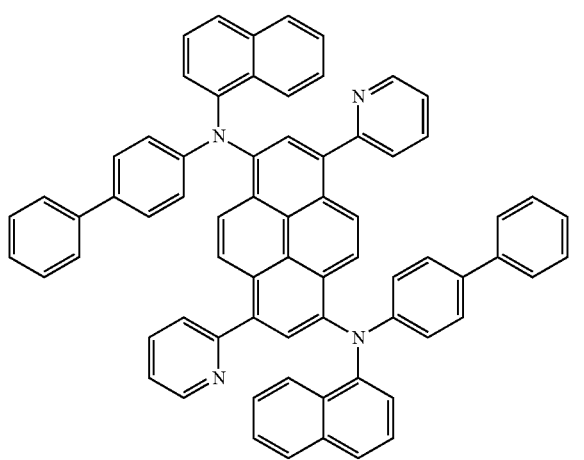

[Formula 3]

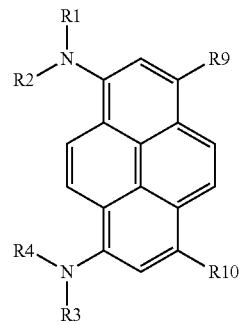

wherein R1, R2, R3 and R4 have the same definition as in Formula 1 and R9 and R10 have the same definition as in Formula 2.

Figure 5:
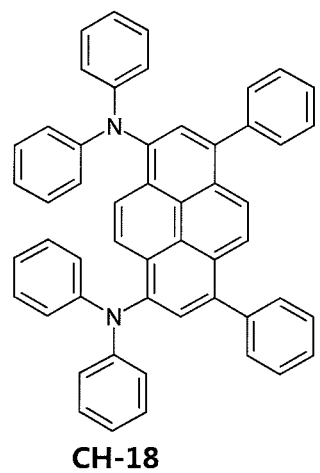
FIG. 5 illustrates compounds represented by Formula 3, contained in the charge generation layer of the present invention.
Figure 5:
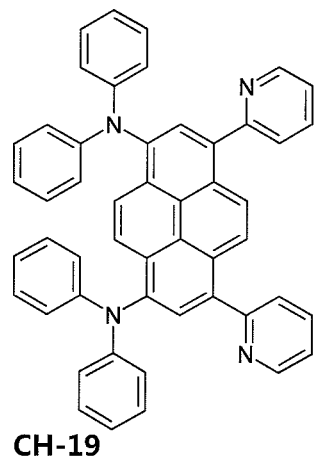
Figure 5:
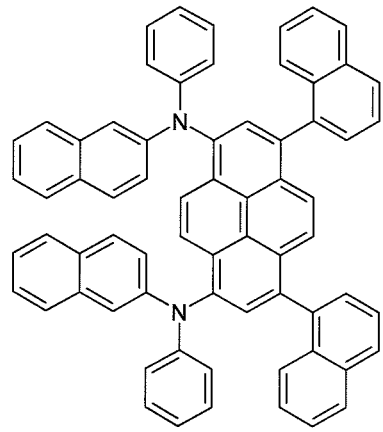
Figure 5:
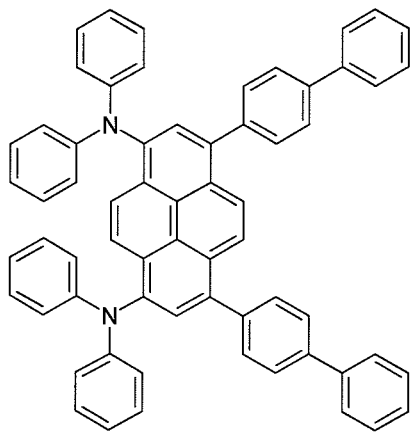

FIG. 5 illustrates compounds represented by Formula 3, contained in the charge generation layer of the present invention.

As shown in FIG. 5, the compounds represented by Formula 3 are CH-18 to CH-21. However, the illustrated examples are only provided as limited examples of the aromatic ring by which R1 to R4 may be substituted, and as limited examples of the aromatic ring or heterocyclic compound by which R9 and R10 may be substituted and the compounds may be substituted in various forms under the conditions as described above associated with Formula 2.

The compounds CH-18 to CH-21 are as follows:

CH-18

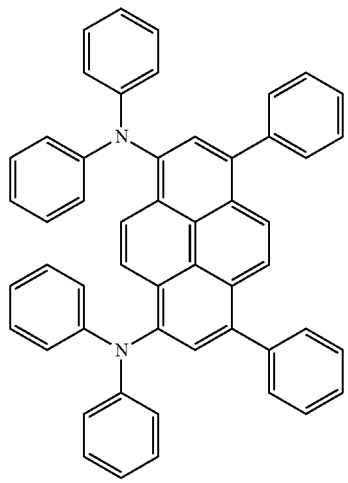

CH-19

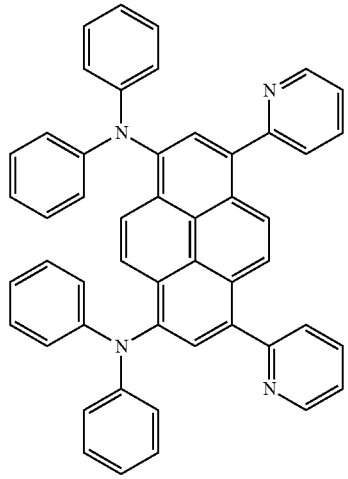

CH-20

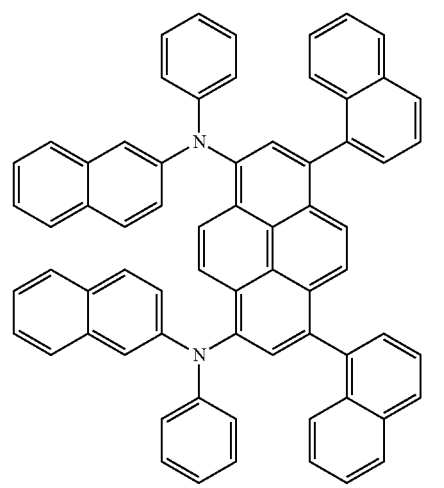

CH-21

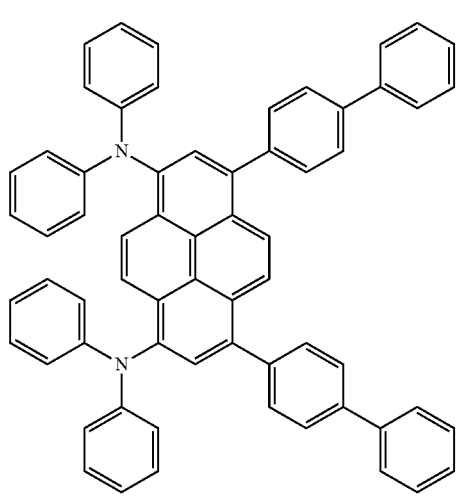

The compounds CH-22 to CH-23 and CH-25 to CH-36 are as follows:

CH-22

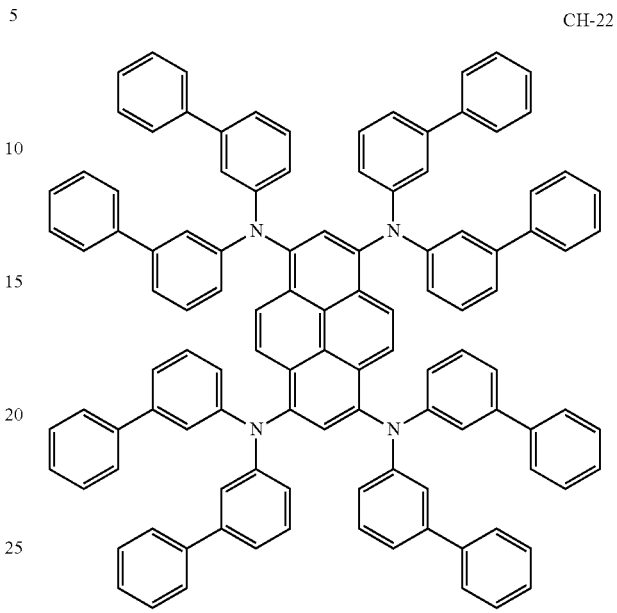

CH-23

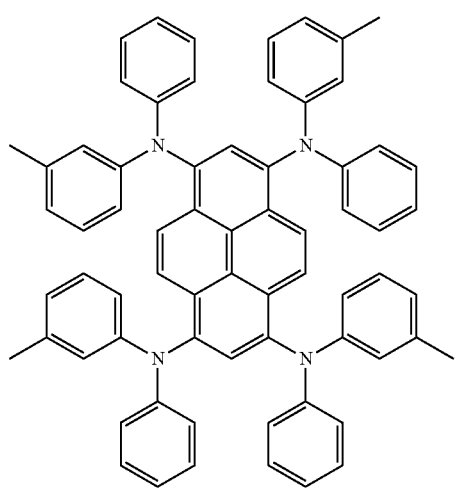

Figure 6:
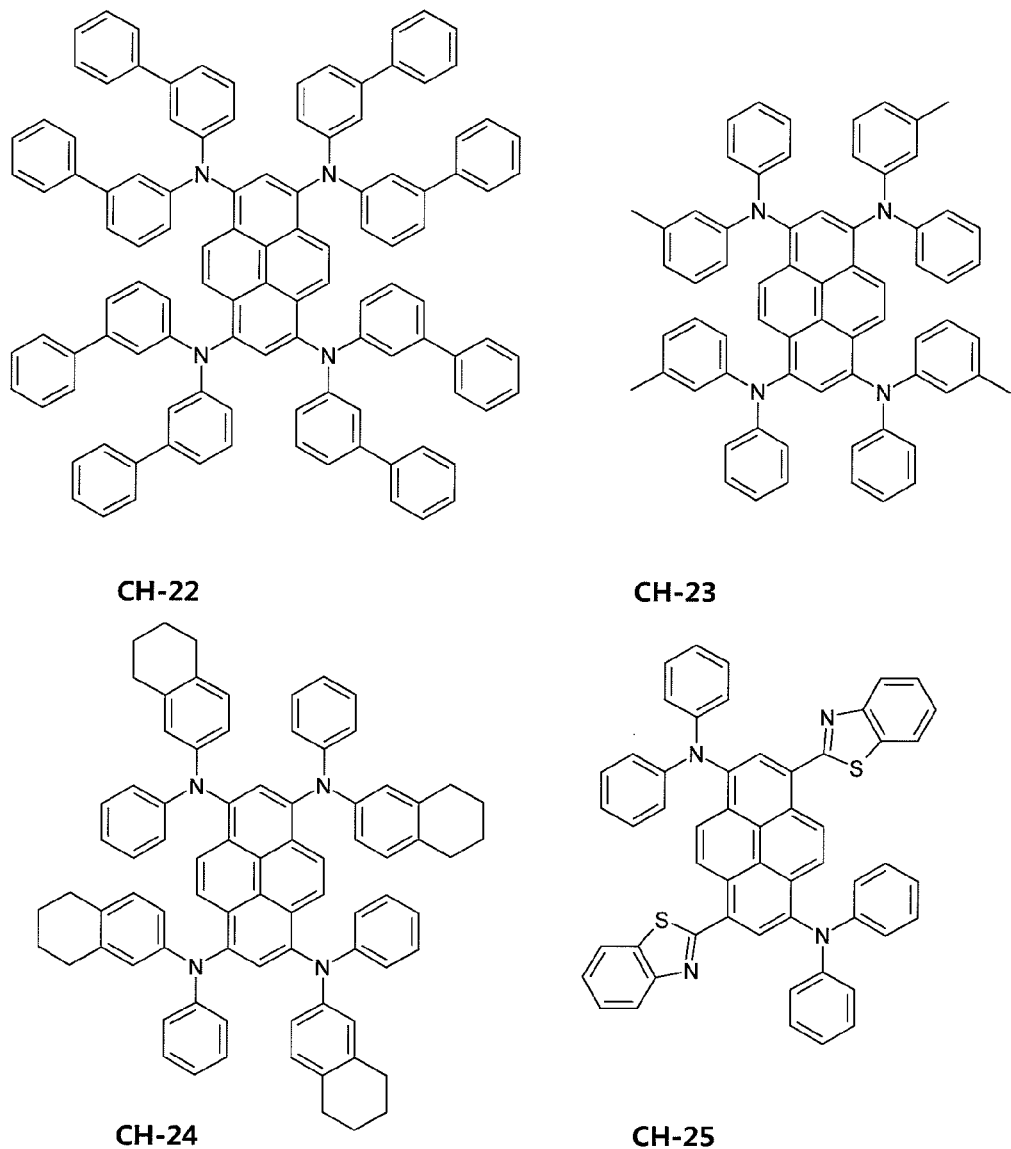
FIG. 6 illustrates compounds represented by Formula 1 or 2, contained in the charge generation layer of the present invention.

FIG. 6 illustrates compounds represented by Formula 1 or 2, contained in the charge generation layer of the present invention.

In FIG. 6, CH-22 to CH-24 are additional compounds represented by Formula 1, and CH-25 to CH-36 are additional compounds represented by Formula 2. Meanwhile, the volume of the compounds of Formulae 1 to 3 contained in the charge generation layer is preferably about 20 to 60% of based on the total volume of organic substances constituting the charge generation layer. More preferably, the volume of at least one of the compounds of Formulae 1 to 3 contained in the charge generation layer is about 30 to 50% of based on the total volume of organic substances constituting the charge generation layer. In addition, the volume of the first organic substance having an electron withdrawing substituent is preferably about 80 to 40% based on the total volume of organic substances constituting the charge generation layer. More preferably, the volume of the first organic substance having an electron withdrawing substituent is about 70 to 50% based on the total volume of organic substances constituting the charge generation layer.

CH-24
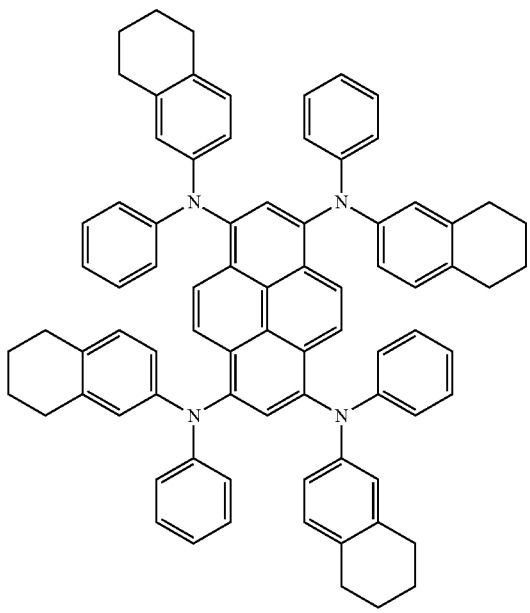
CH-27
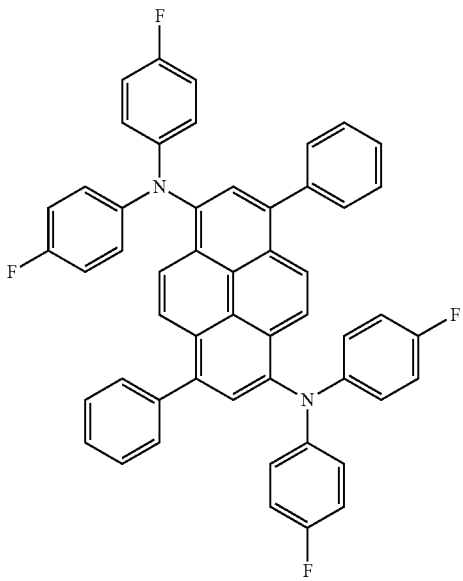
CH-25
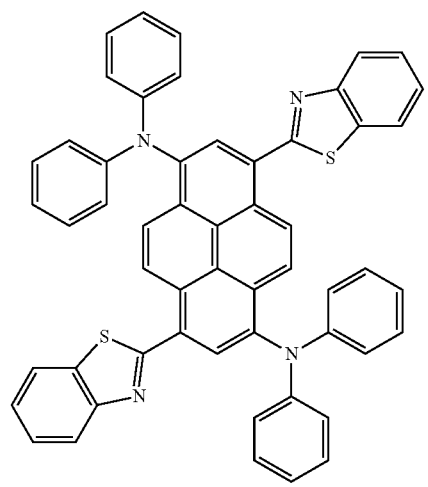
CH-28
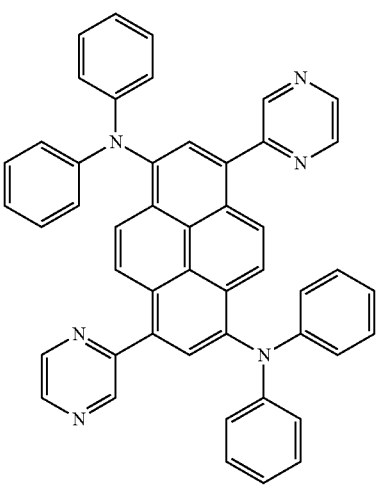
CH-26
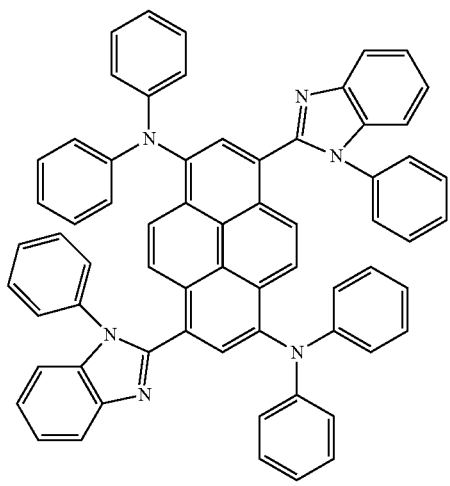
CH-29
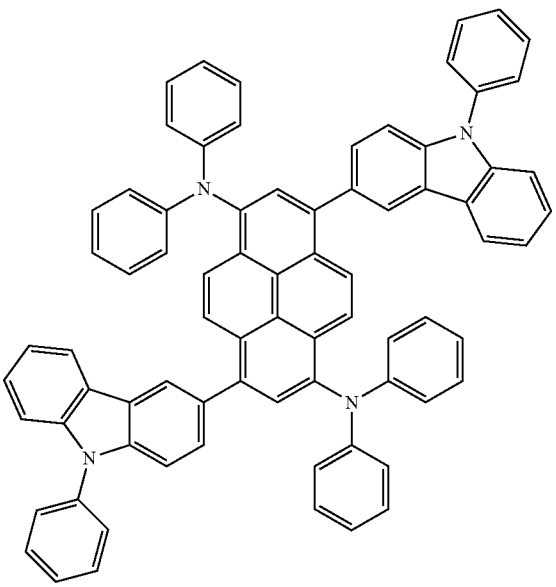

CH-30
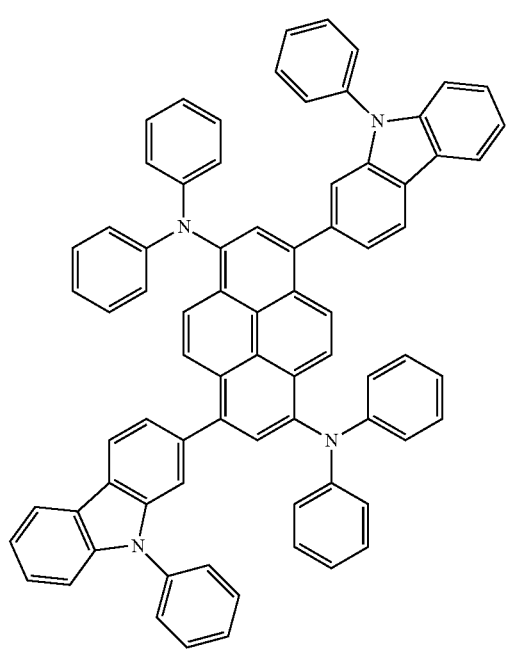
CH-31
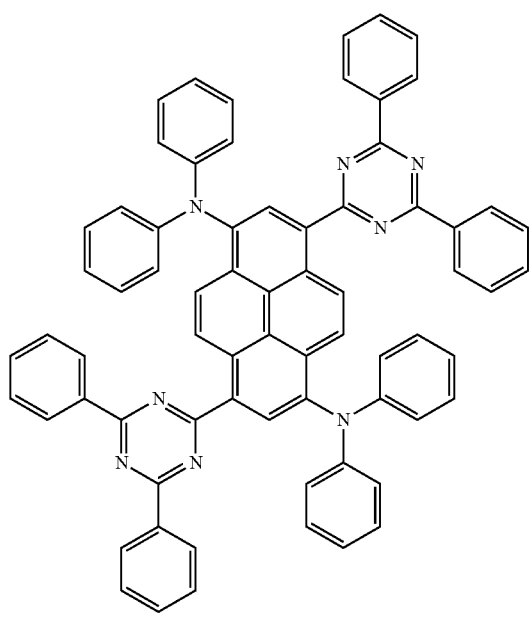
CH-32
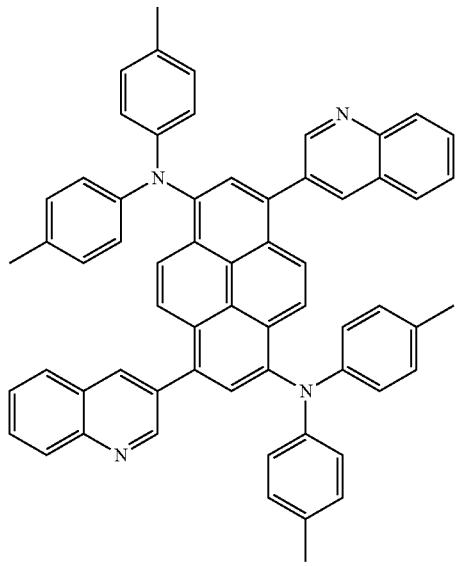
CH-33
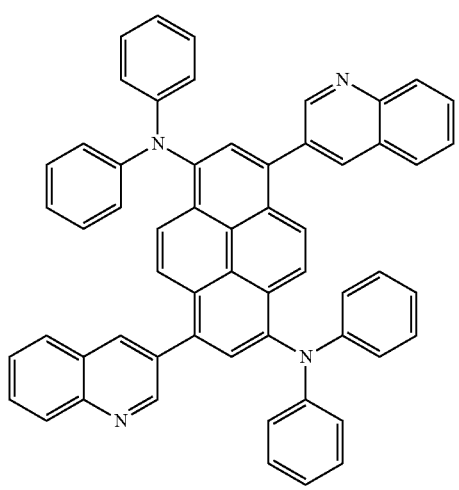
CH-34
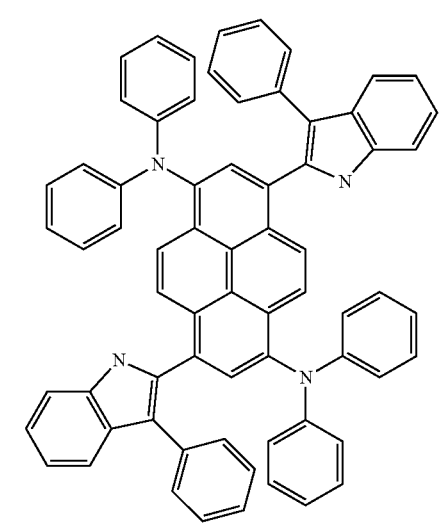

CH-35

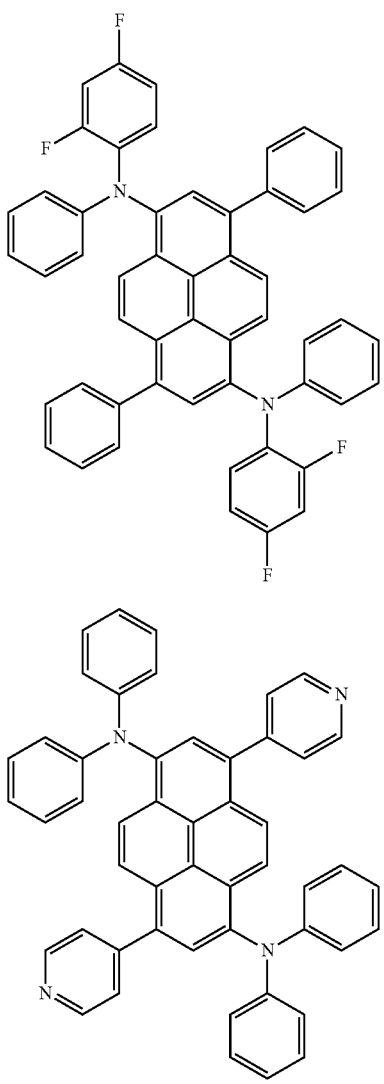

CH-36

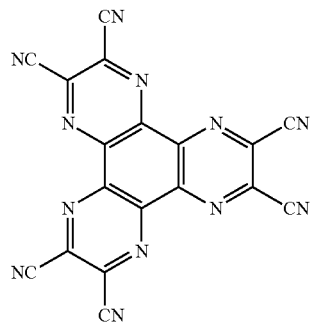

[Formula 4]

Also, the stack has common layers disposed on and under the light emitting layer and the second common layer of the lower stack adjacent to the charge generation layer may further contain an n-type organic layer that helps injection of electrons from the charge generation layer. In this case, the n-type organic layer may further contain an inorganic compound having a low work function.

Also, in some cases, in an organic light emitting device including a hole injection layer, a hole transport layer, a light emitting layer and an electron transport layer interposed between a first electrode and a second electrode, the compounds represented by Formulae 1 to 3 may be used as a material for the hole transport layer.

Now, the present invention will be described in more detail with reference to the following examples. These examples are only provided to illustrate the present invention and should not be construed as limiting the scope and spirit of the present invention.

Also, the charge generation layer can be any thickness so long as it can satisfactorily retain its properties, but preferably this charge generation layer has a thickness of 75 Å to 250 Å. More preferably, the charge generation layer has a thickness of about 100 Å to 150 Å.

The compounds of Formulae 1 to 3 roughly have characteristics of a p-type semiconductor and function to increase the amount of holes injected into the first common layer that is a lower common layer of the stack.

Also, the charge generation layer may further contain, in addition to the compounds of Formulae 1 to 3, an organic substance capable of generating charges. For example, the further contained organic substance may be HAT-CN (Formula 4), as a first organic substance (having an electron-withdrawing substituent). As such, the charge generation layer is formed using a mixture of the organic substance generating charges constituting the charge generation layer, with a substance facilitating charge generation (see Formulae 1 to 3), thereby maximizing production of holes in the charge generation layer and bulk-producing charges at the interface between the charge generation layer and the first common layer of the upper stack to reduce a driving voltage and improve efficiency.

EXAMPLES

CH-02 is prepared in accordance with the following manner.

1) Pyrene Substance Substituted by Bromine

[Reaction scheme 1]

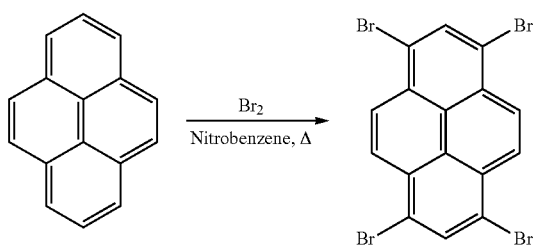

Pyrene (20 g) was added to a dry two-neck flask, nitrobenzene (1000 ml) was added thereto, and pyrene was completely dissolved. Then, the mixture was stirred in a bath at a temperature of 130° C. Bromine was added dropwise with stirring. After stirring in the bath at 130° C. for 15 hours, 1,3,6,8-tetrabromopyrene (32 g) was obtained as an intermediate.

2) CH-02 Substance

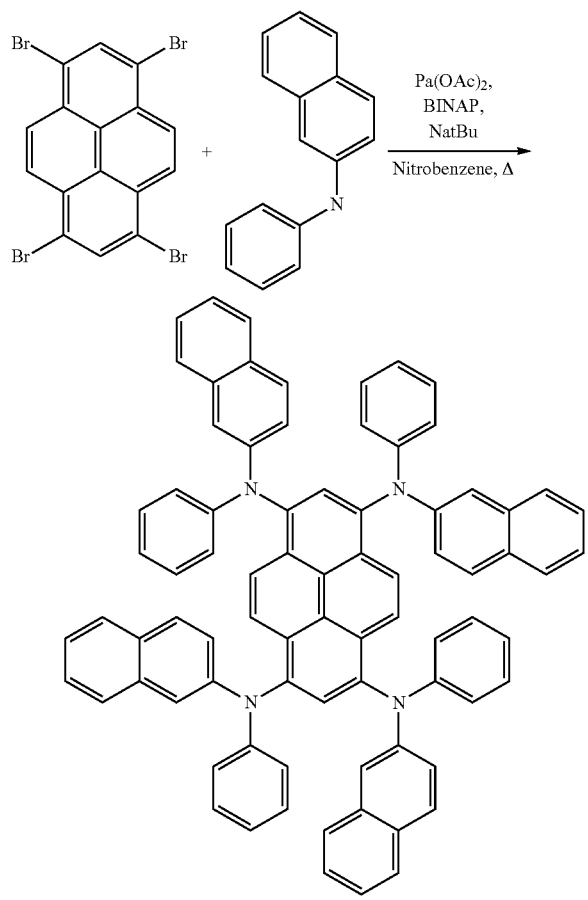

[Reaction scheme 2]

1,3,6,8-tetrabromopyrene (6 g), phenylnaphthylamine (10 g), palladium acetate (0.6 g), BINAP (1.2 g), NaOtBu (15 g) were added to a thoroughly dried two-neck flask and were dissolved in toluene (100 ml). Then, the resulting solution was stirred at 130° C. in a bath for 24 hours to obtain a yellow crystal. The crystal was recrystallized and purified to obtain a CH-02 substance {1,3,6,8-tetra-(Phenyl-2-naphthylamino)pyrene}, as the target compound of the present invention.

Meanwhile, the inventors of the present invention mixed charge generation layer materials of Formulae 1 to 3 and HAT-CN at different volume ratios and found improved driving voltage and efficiency, as compared to a case in which HAT-CN alone was used as a material for the charge generation layer.

Figure 7:
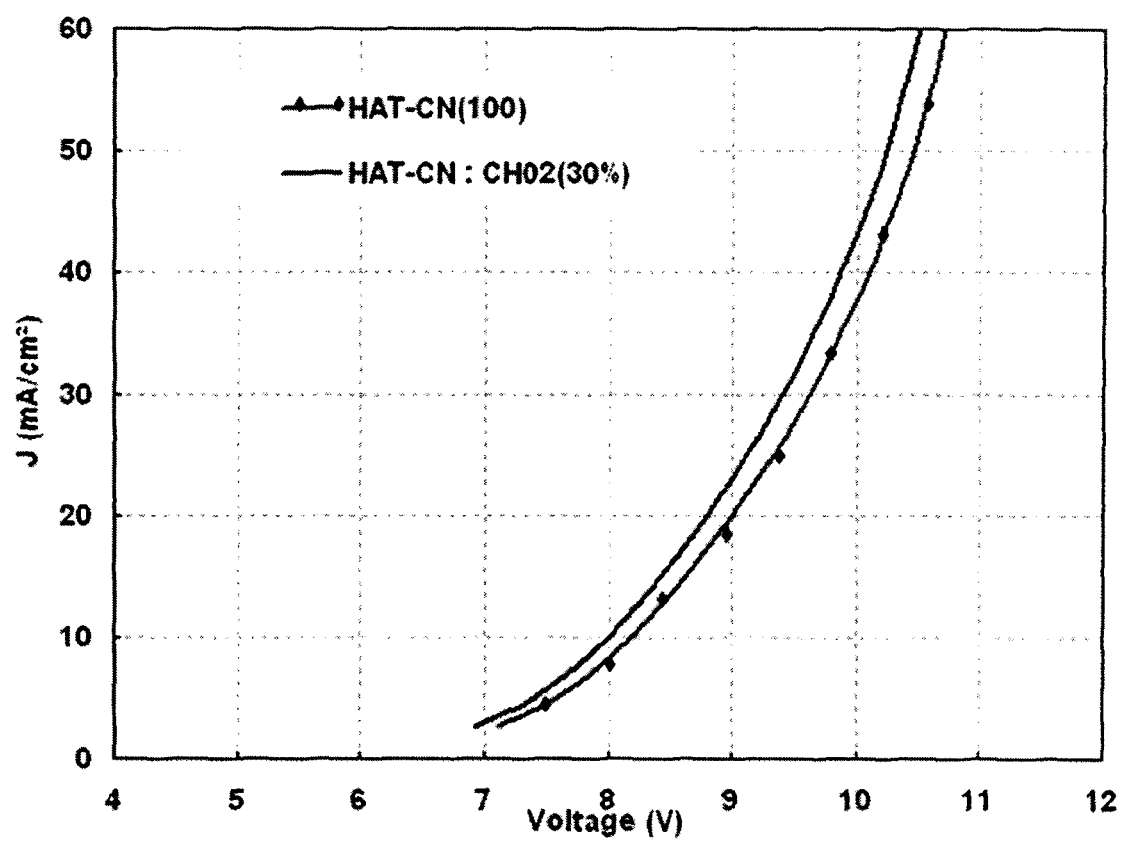
FIG. 7 is a graph showing current density according to a driving voltage when charge generation layers of the present invention and Comparative Example are used.

FIG. 7 is a graph showing a current density according to a driving voltage when charge generation layers of the present invention and Comparative Example are used.

As shown in FIG. 7, a case in which a charge generation layer (CGL) is formed using 30% of CH-02 (see FIG. 3) represented by Formula 1 and the balance of HAT-CN as another organic substance (see Example 1 of Table 1) exhibited a high current density according to a driving voltage, as compared to a case in which the charge generation layer is formed only using HAT-CN (Comparative Example). In particular, as voltage increases, an increase in current density is improved.

Here, in both Example 1 and Comparative Example, the charge generation layer has a thickness of 100 Å.

Figure 8:
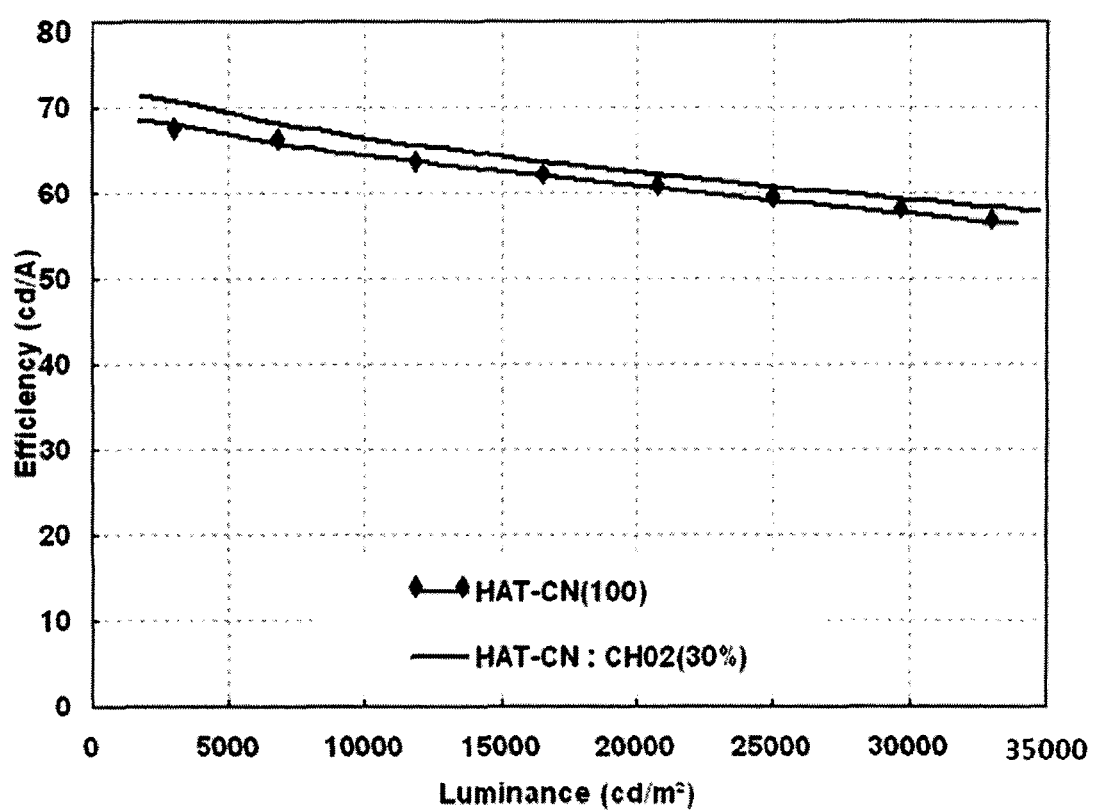
FIG. 8 is a graph showing efficiency according to luminance, when the charge generation layer of the present invention and Comparative Example are used.

FIG. 8 is a graph showing efficiency according to luminance, when the charge generation layer of the present invention and Comparative Example are used.

As can be seen from FIG. 8, Example 1 exhibited a higher efficiency according to luminance than the Comparative Example. In particular, Example 1 exhibited a high efficiency at a low luminance, as compared to the Comparative Example.

TABLE 1

| | | | CGL | | | | | |
|---|---|---|---|---|---|---|---|---|
| | Organic substance 1 | Organic substance 2 | Volume of organic substance 2 (%) | Thickness (Å) | Current density (mA/cm$^2$) | Driving voltage (V) | EQE (%) | CIE* (xy) |
| Ex. 1 | HAT-CN | CH-02 | 30 | 100 | 10 | 8.05 | 28.3 | 0.332 0.321 |
| Ex. 2 | HAT-CN | CH-02 | 50 | 100 | 10 | 8.12 | 28.5 | 0.332 0.325 |
| Ex. 3 | HAT-CN | CH-14 | 30 | 100 | 10 | 8.09 | 28.1 | 0.332 0.323 |
| Ex. 4 | HAT-CN | CH-14 | 30 | 150 | 10 | 8.13 | 28.0 | 0.332 0.322 |
| Comp. Ex. | HAT-CN | — | — | 100 | 10 | 8.23 | 28.0 | 0.332 0.327 |

*CIE is the International Commission on Illumination

Table 1 shows test examples in which compounds represented by different Formulae are used as organic substances contained in materials for the charge generation layer, or the compounds are applied at different volume ratios or thicknesses, as shown in Examples 1 to 4. In the all tests, a current density was 10 mA/cm$^2$.

Here, in Example 1, CH-02 in the charge generation layer was used at a volume ratio of 30% as an organic substance 2 and HAT-CN was used at a volume ratio of 70% as an organic substance 1, and the charge generation layer had a thickness of 100 Å. In this case, driving voltage was 8.05V and external quantum efficiency (EQE) was 28.3%. In this case, CIE (x, y) was 0.332, 0.321, which was substantially equivalent to the color coordinate of Comparative Example (in which the charge generation layer is made of only HAT-C). Accordingly, Example 1 exhibited a lower driving voltage and a higher external quantum efficiency than the Comparative Example.

In Example 2, CH-02 in the charge generation layer was used at a volume ratio of 50% as an organic substance 2 and HAT-CN was used at a volume ratio of 50% as an organic substance 1, and the charge generation layer had a thickness of 500 Å. In this case, driving voltage was 8.12V and external quantum efficiency (EQE) was 28.5%. In this case, CIE (x,y) were 0.332, 0.325, which was substantially equivalent to the color coordinate of Comparative Example (in which the charge generation layer is made of only HAT-C). Accordingly, Example 2 exhibited a lower driving voltage and a higher external quantum efficiency than the Comparative Example.

In Example 3, CH-14 in the charge generation layer was used at a volume ratio of 30% as an organic substance 2 and HAT-CN was used at a volume ratio of 70% as an organic substance 1, and the charge generation layer had a thickness of 100 Å. In this case, a driving voltage was 8.09V and external quantum efficiency (EQE) was 28.1%. In this case, CIE (x, y) was 0.332, 0.323, which was substantially equivalent to the color coordinate of Comparative Example (in which the charge generation layer is made of only HAT-C). Accordingly, Example 3 exhibited a lower driving voltage and a higher external quantum efficiency than the Comparative Example.

In Example 4, CH-14 in the charge generation layer was used at a volume ratio of 30% as an organic substance 2 and HAT-CN was used at a volume ratio of 70% as an organic substance 1, and the charge generation layer had a thickness of 150 Å. In this case, driving voltage was 8.13V and external quantum efficiency (EQE) was 28.0%. In this case, CIE (x,y) was 0.332, 0.322, which was substantially equivalent to the color coordinate of Comparative Example (in which the charge generation layer is made of only HAT-C). Accordingly, Example 4 exhibited a lower driving voltage and a higher external quantum efficiency than the Comparative Example.

All Examples exhibited low driving voltages, as compared to Comparative Example, and all examples except Example 4 exhibited high external quantum efficiencies as compared to the Comparative Example. Example 4 exhibited superior driving voltage decrease effects, as compared to the Comparative Example. For this reason, Example 4 is also considered to exhibit a high current density at a constant driving voltage and a high efficiency according to luminance as compared to the Comparative Example.

As such, when a charge generation layer is formed using at least one of Formulae 1 to 3 of the present invention, a decrease in driving voltage and an increase in efficiency are expected. As a result, lifespan of a tandem organic light emitting device is expected to increase.

Test examples associated with Examples 1 to 4 and Comparative Example are described based on structures shown FIGS. 1 and 2. The following test example is an example in which a tandem organic light emitting device is implemented with two stacks. Test examples are classified into Examples and Comparative Example, depending on the component of the charge generation layer and the remaining layers were tested under the same component and thickness conditions as in Examples and Comparative Example.

Test Example

Examples 1 to 4 use CH-02 and CH-14 for the charge generation layer, but other compounds that can be represented by Formulae 1 to 3 may be also used as the charge generation layer. Also, materials of the charge generation layer as well as the light emitting layer and common layers of the stack are not limited and any materials may be used as long as they maintain functionality of the corresponding layers.

First, a thin film transistor array including a thin film transistor (not shown) at each pixel in a matrix is formed on a transparent substrate (not shown).

Then, as shown in FIG. 1, a first electrode 100 is used as an anode material such that the first electrode 100 is connected to the thin film transistor. Indium tin oxide (ITO) is generally used as the anode material.

Then, as shown in FIG. 2, a first common layer 11 is formed as a first stack 110a on the first electrode 100. The first common layer 11 is formed by sequentially depositing HAT-CN (Formula 4) as a hole injection layer to 50 Å, and a hole transport layer is formed with either a combination of NPD (Formula 5) (4,4'-bis[N-(1-naphthyl)-N-phenylamino]-biphenyl) and NBPD (N,N'-diphenyl-N-naphthyl-N'-biphenyl-1,1'-biphenyl-4,4"-diamine) or TCTA (Formula 6) to 1250 Å and 200 Å, respectively.

Then, a first light emitting layer 15 is formed on the first common layer 11. The first light emitting layer 15 is formed to a thickness of about 250 Å using ADN (Formula 7) and tBu-perylene (Formula 8).

Then, a second common layer 12 is formed on the first light emitting layer 15. The second common layer 12 is formed by depositing LGC ETL (Formula 9) as an electron transport layer to a thickness of about 250 Å and depositing BPhen (Formula 10) to a thickness of 100 Å as an electron injection layer. A small amount of lithium was doped in the electron injection layer of the second common layer 12, to facilitate electron injection. In this case, the electron injection layer also serves as an n-type organic semiconductor layer.

Also, one unit including the first common layer 11, the first light emitting layer 15 and the second common layer 12 is referred to as a first stack.

Then, in Examples 1 to 4, the charge generation layer 120a is formed to a thickness of 100 Å or 150 Å using CH-02 or CH-14, while, in Comparative Example, the charge generation layer 120a is formed to a thickness of about 100 Å using HAT-CN (Formula 4).

Then, a third common layer (similar to 11 in FIG. 2), a second light emitting layer (similar to 15 in FIG. 2) and a fourth common layer (similar to 12 in FIG. 2) are sequentially deposited as a second stack 110b on the charge generation layer 120a. The third common layer and the fourth common layer of the first common layer are the same material as those of the second common layer and have different thickness from those of the second common layer.

Here, the third common layer is formed by sequentially depositing NPD and TCTA to thicknesses of 450 Å and 200 Å, respectively.

Then, a second light emitting layer is formed on the third common layer. The second light emitting layer is a light emitting layer that contains a combination of BAlq (Formula 11) with a YG dopant (Formula 12) and is formed to a thickness of about 300 Å.

Then, a fourth common layer (similar to 12 in FIG. 2) is formed on the second light emitting layer. The fourth common layer is formed by sequentially depositing LGC ETL and LiF to about 350 Å and about 10 Å, respectively.

Then, a second electrode 200 is formed as a cathode using a reflective metal such as Al on the fourth common layer.

[Formula 5]

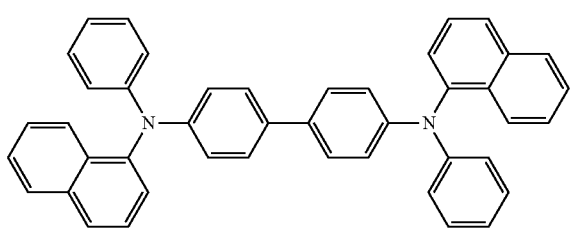

[Formula 6]

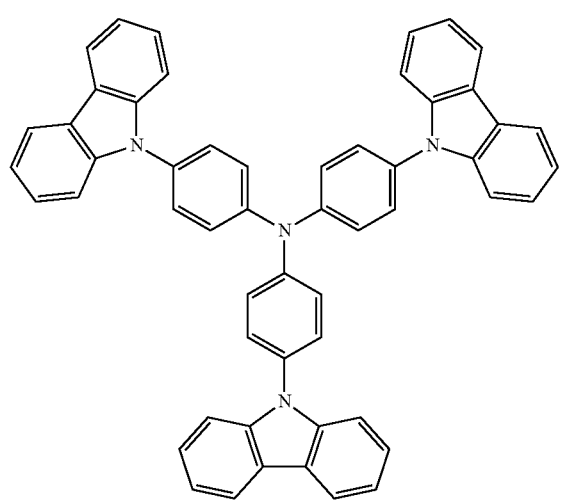

[Formula 7]

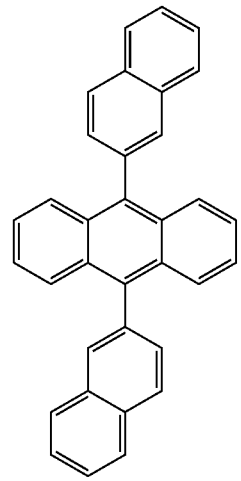

[Formula 8]

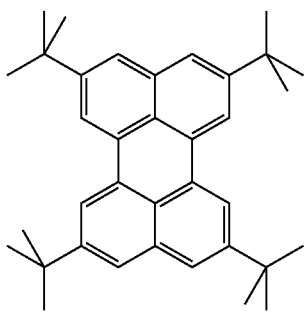

[Formula 9]

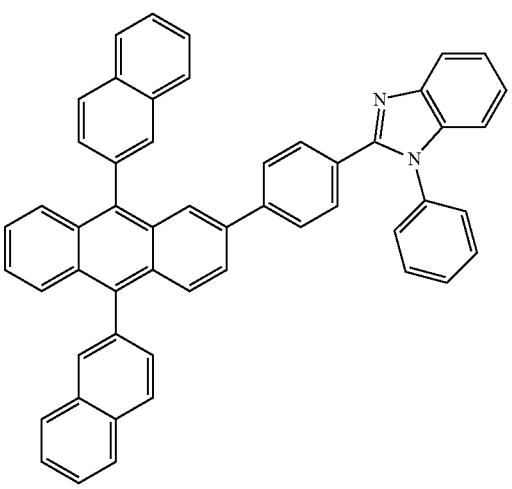

[Formula 10]

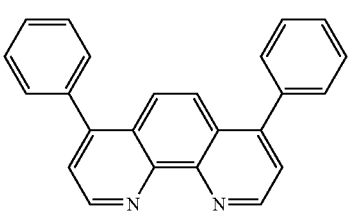

[Formula 11]

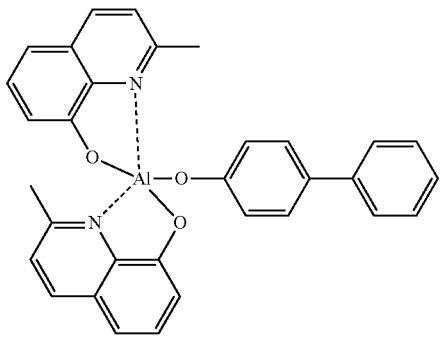

-continued

[Formula 12]

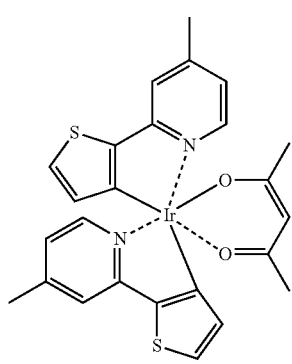

Also, as described above, the compounds represented by Formulae 1 to 3 may be useful as materials for the first common layer of stacks, for example, materials for hole injection, in terms of facilitation of hole injection.

The organic light emitting device according to the present invention has the following advantages.

It is possible to stably inject electrons and holes into an adjacent first stack and an adjacent second stack, respectively, and thereby decrease driving voltage and improve efficiency by forming a charge generation layer using a novel material facilitating charge generation.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device comprising:
a first electrode and a second electrode opposing each other;
a plurality of stacks interposed between the first electrode and the second electrode, each stack comprising a light emitting layer; and
a charge generation layer to connect the adjacent stacks,
wherein the charge generation layer consists of a mixture of a first organic substance having an electron-withdrawing substituent and a second organic substance capable of injecting holes, and
wherein the second organic substance capable of injecting holes is at least one compound is selected from the group consisting of Formula 2, Formula 3, CH-02, CH-03, CH-04, CH-06, CH-07, CH-08 and CH-24:

[Formula 2]

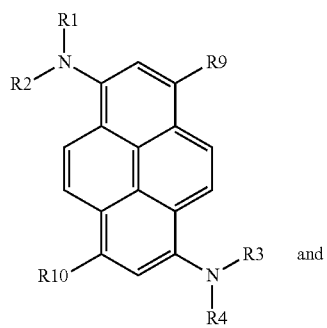

and

-continued

[Formula 3]

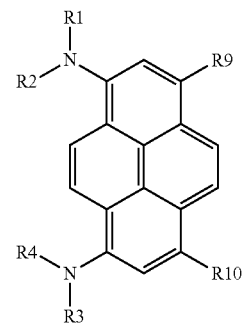

wherein R1, R2, R3 and R4 are optionally substituted and are independently selected from an aromatic group having 6 to 20 carbon atoms, and R9 and R10 are independently selected from the group consisting of an optionally substituted aromatic ring having 6 to 20 carbon atoms, and an optionally substituted heterocyclic compound having 3 to 17 carbon atoms and one or more elements of N, S and P, and

CH-02

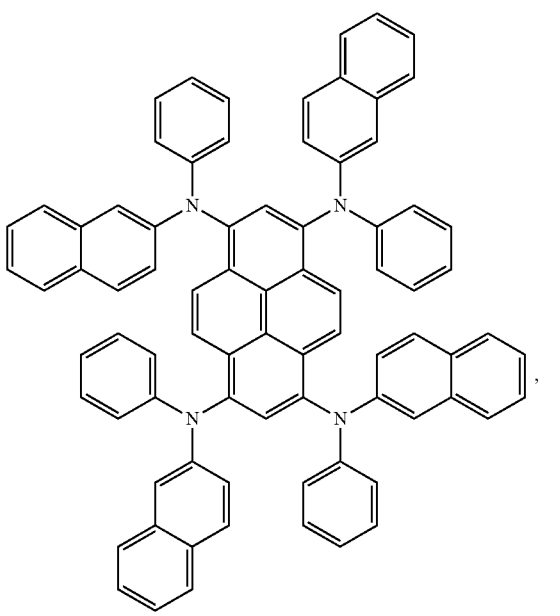

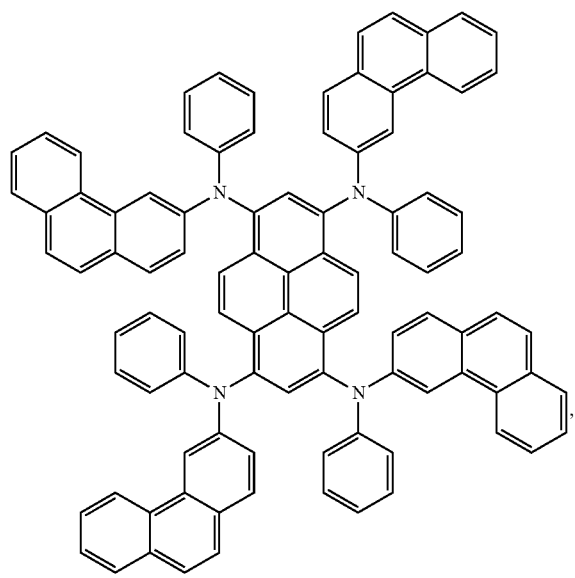
CH-03
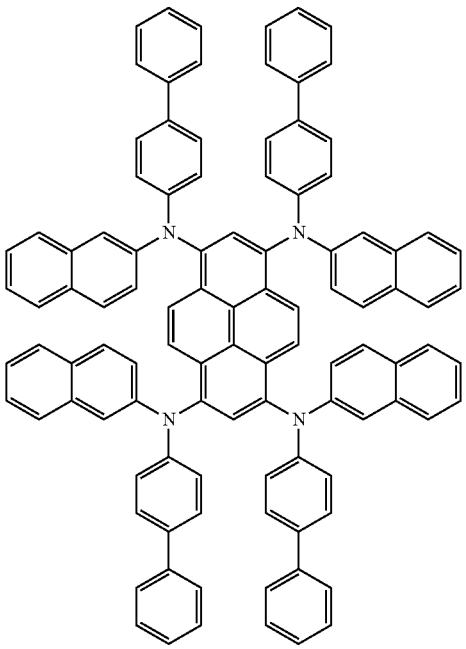
CH-06
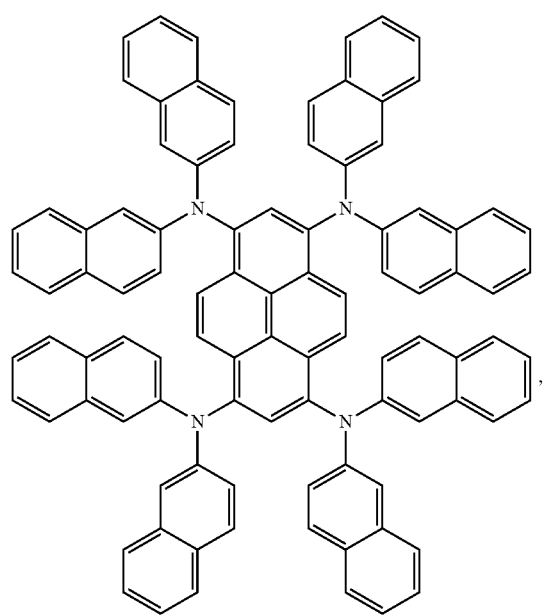
CH-04
CH-07
CH-08

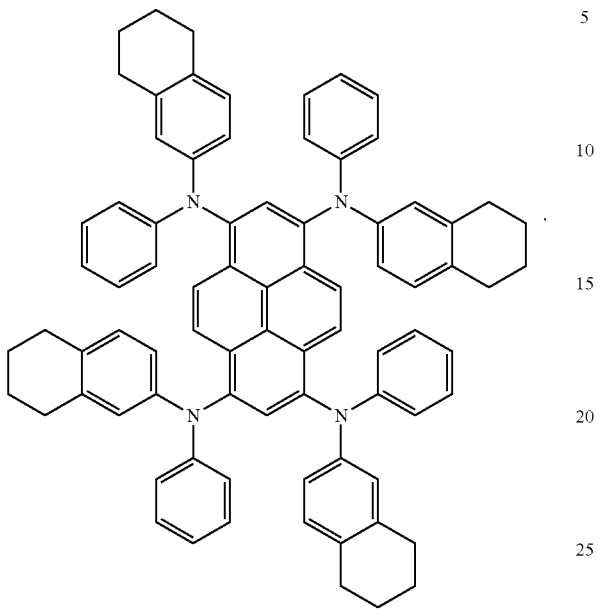

CH-24

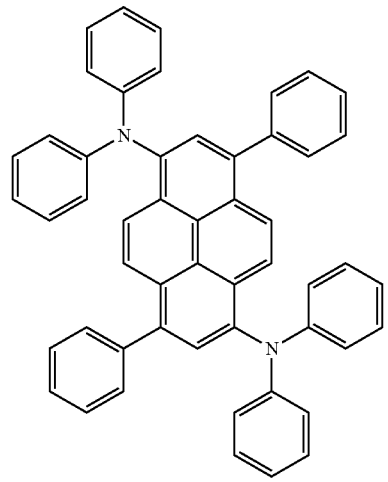

CH-10

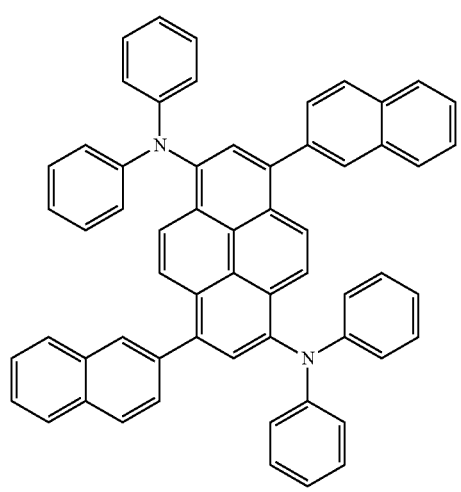

CH-11

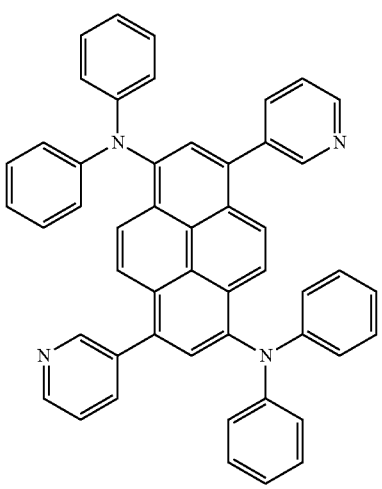

CH-12

2. The organic light emitting device according to claim 1, wherein the first organic substance has one or more substituents of CN, $NO_2$ and F.

3. The organic light emitting device according to claim 1, wherein each stack further comprises a first common layer and a second common layer provided on and under the light emitting layer, respectively.

4. The organic light emitting device according to claim 1, wherein the light emitting layers emit light having a different color such that the mixed light emitted from the organic light emitting device appears white.

5. The organic light emitting device according to claim 1, wherein the volume of the at least one compound of Formula 2, Formula 3, CH-02, CH-03, CH-04, CH-06, CH-07, CH-08 and CH-24 contained in the charge generation layer is 20 to 60% of the total volume of organic substances constituting the charge generation layer.

6. The organic light emitting device according to claim 1, wherein the charge generation layer has a thickness of 75 Å to 250 Å.

7. The organic light emitting device according to claim 1, wherein the first organic substance having an electron withdrawing group is HAT-CN.

8. The organic light emitting device according to claim 3, wherein a sublayer of the second common layer adjacent to the charge generation layer is an n-type organic layer.

9. The organic light emitting device according to claim 3, wherein the first common layer comprises at least one compound represented by Formula 2, Formula 3, CH-02, CH-03, CH-04, CH-06, CH-07, CH-08 and CH-24.

10. The organic light emitting device according to claim 5, wherein the volume of the first organic substance having an electron-withdrawing substituent contained in the charge generation layer is 80 to 40% of the total volume of organic substances constituting the charge generation layer.

11. The organic light emitting device according to claim 1, wherein the at least one compound of Formula 2 and Formula 3 is selected from the group consisting of:

-continued
CH-13
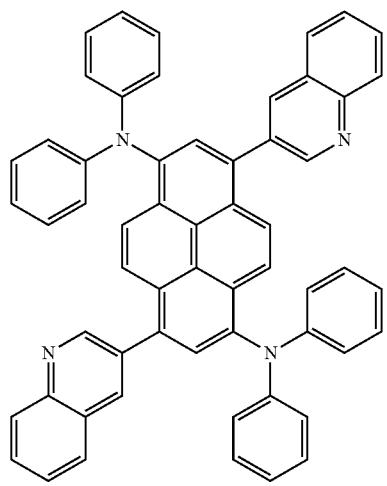
CH-14
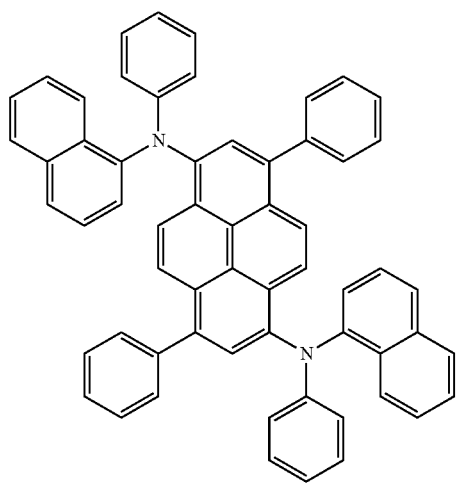
CH-15
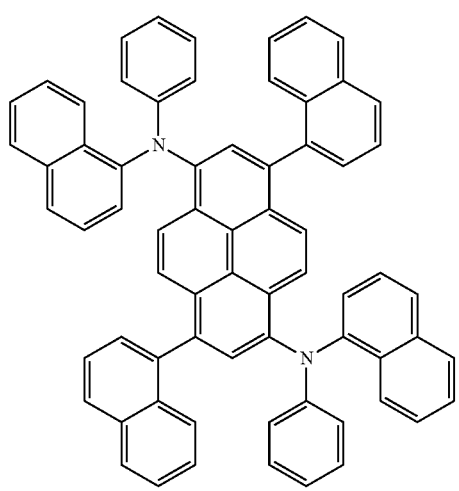
-continued
CH-16
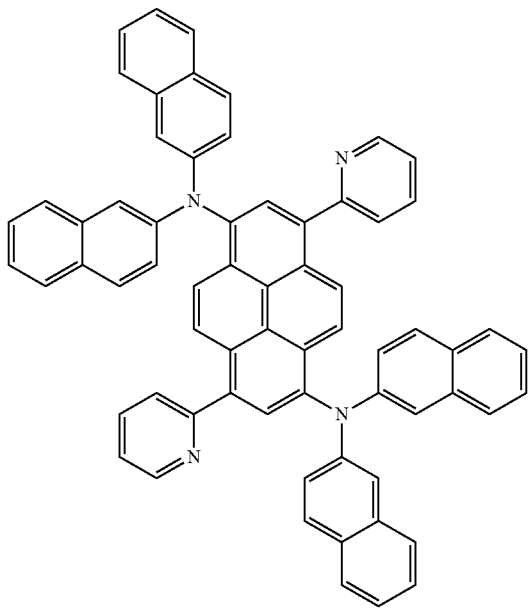
CH-17
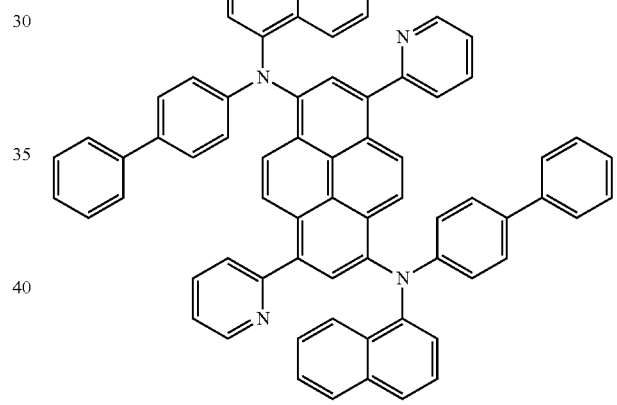
CH-18
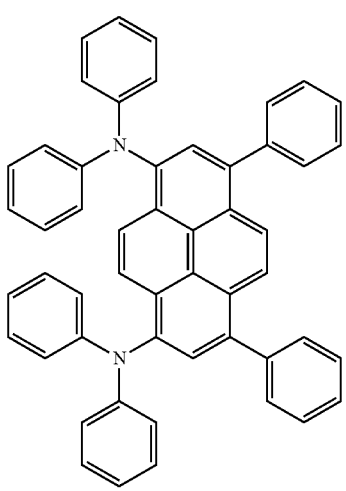

CH-19
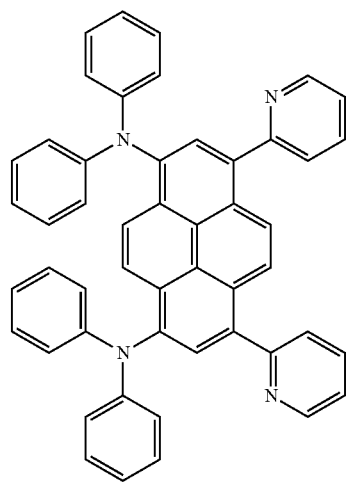
CH-20
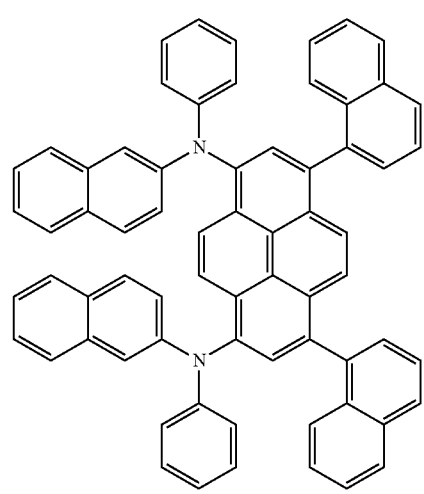
CH-21
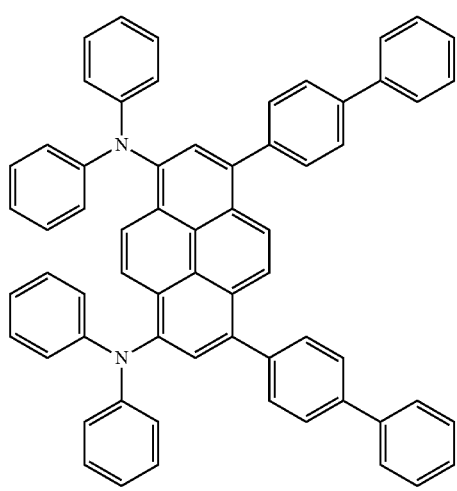
CH-25
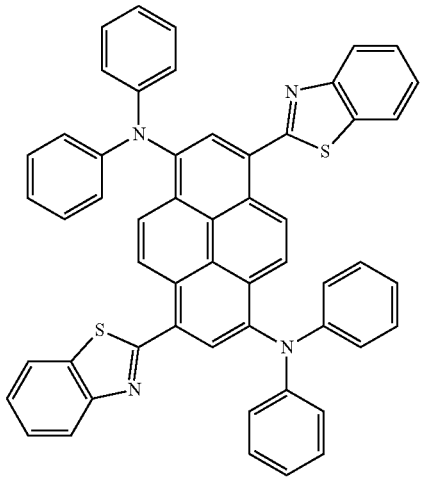
CH-26
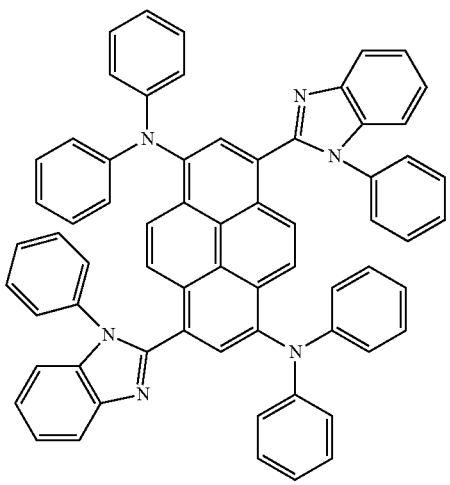
CH-27
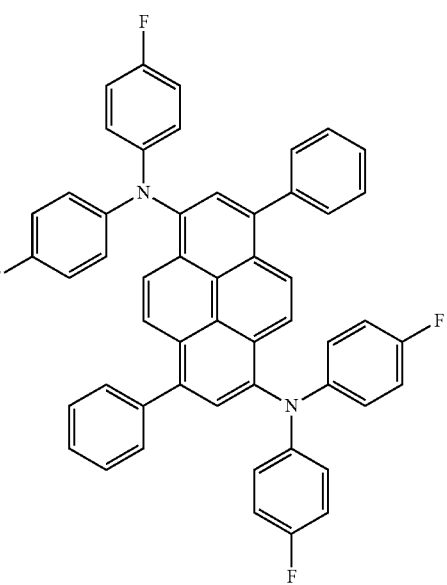

CH-28
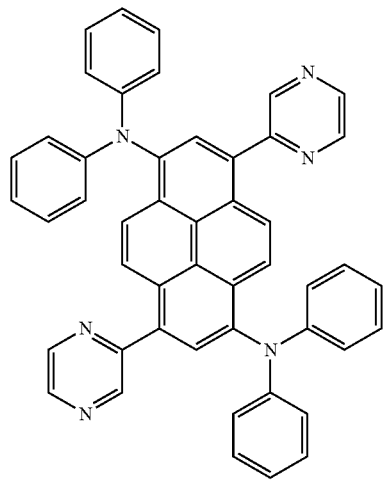
CH-30
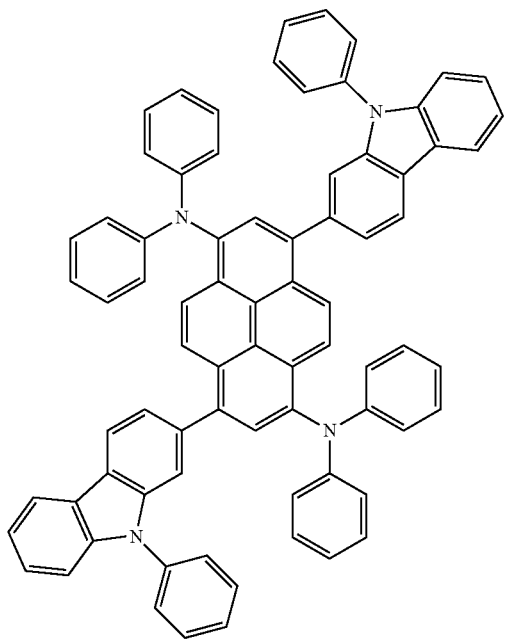
CH-29
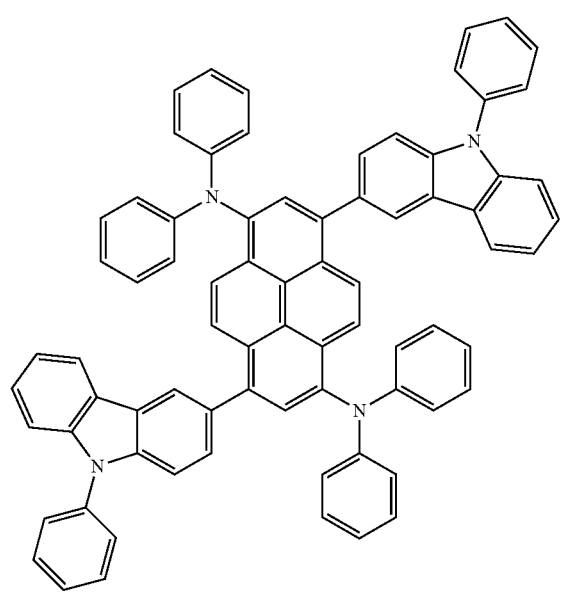
CH-31
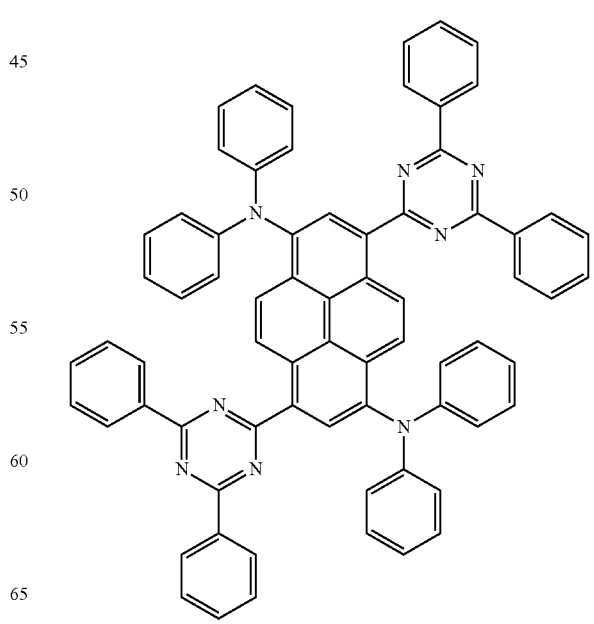

-continued
CH-32
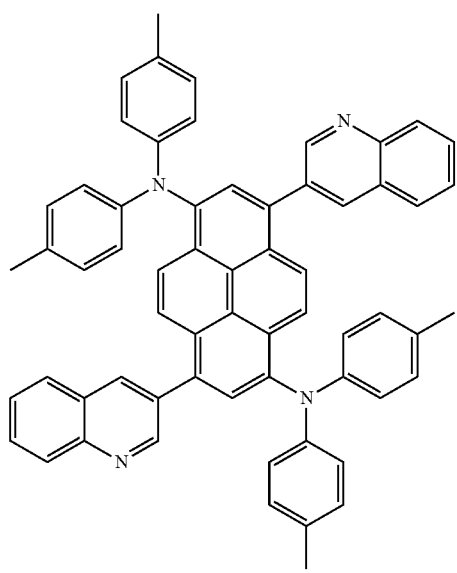
CH-33
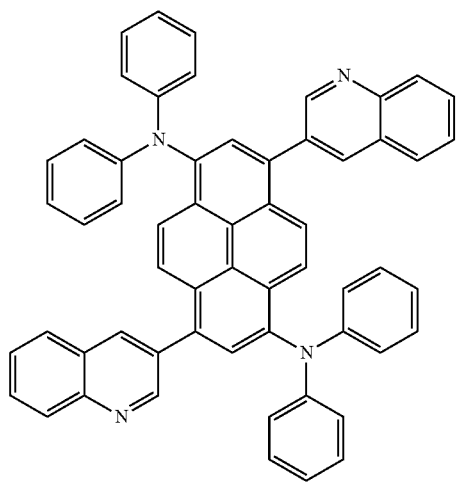
CH-34
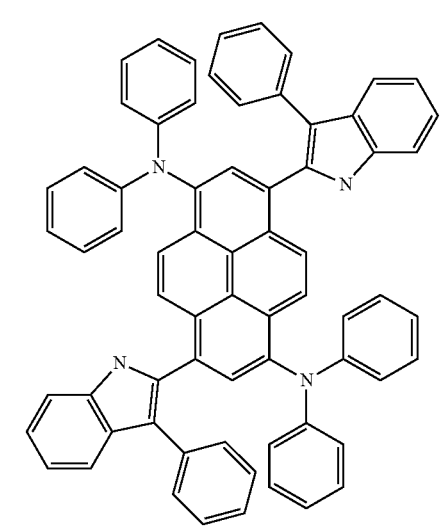
-continued
CH-35
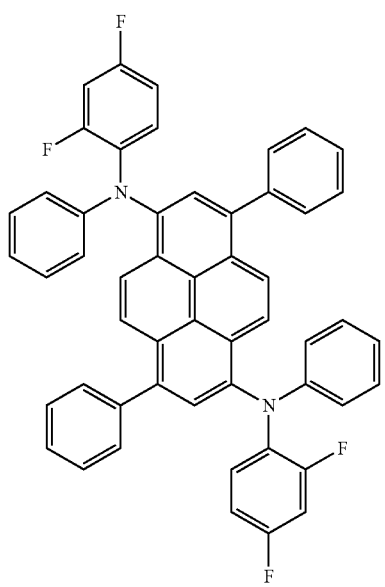
CH-36
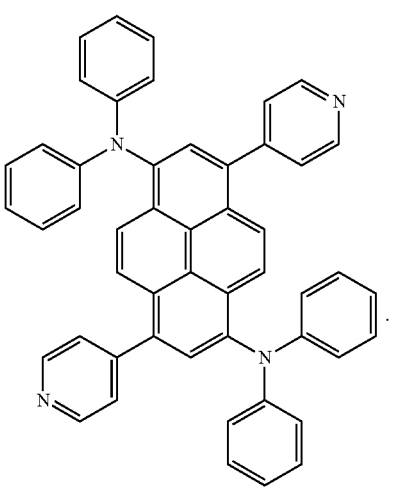
12. The organic light emitting device according to claim 1, wherein the at least one compound is selected from the group consisting of CH-02 and a compound of Formula 2 that is represented by CH-14:
CH-14
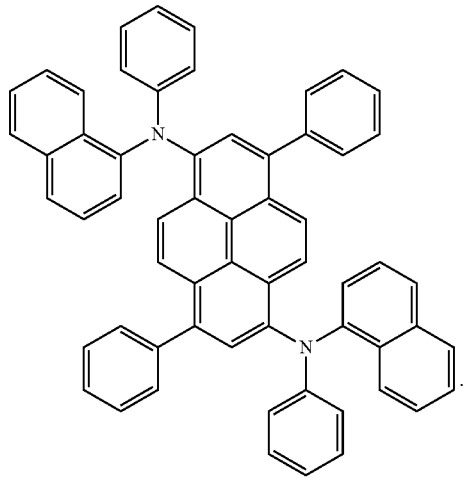

13. An organic light emitting device comprising:
   a first electrode and a second electrode opposing each other;
   a plurality of stacks interposed between the first electrode and the second electrode, each stack comprising a first common layer, a light emitting layer, and a second common layer in sequence; and
   a charge generation layer to connect the adjacent stacks,
   wherein the charge generation layer consists of a mixture of a first organic substance having an electron-withdrawing substituent and a second organic substance capable of injecting holes, and
   wherein the second organic substance capable of injecting holes and the first common layer comprises at least one compound is selected from the group consisting of Formula 2, Formula 3, CH-02, CH-03, CH-04, CH-06, CH-07, CH-08 and CH-24:

[Formula 2]

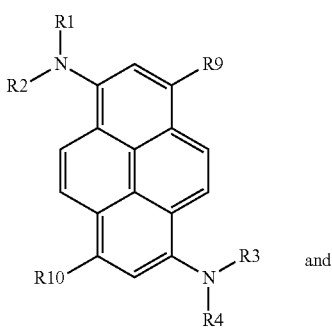

and

[Formula 3]

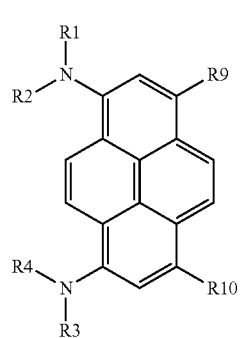

wherein R1, R2, R3 and R4 are optionally substituted and are independently selected from an aromatic group having 6 to 20 carbon atoms, and
R9 and R10 are independently selected from the group consisting of hydrogen, an optionally substituted aromatic ring having 6 to 20 carbon atoms, and an optionally substituted heterocyclic compound having 3 to 17 carbon atoms and one or more elements of N, S and P,

CH-02

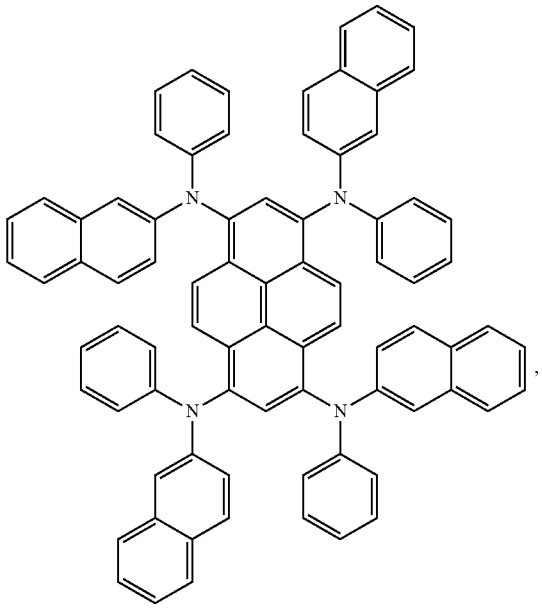

,

CH-03

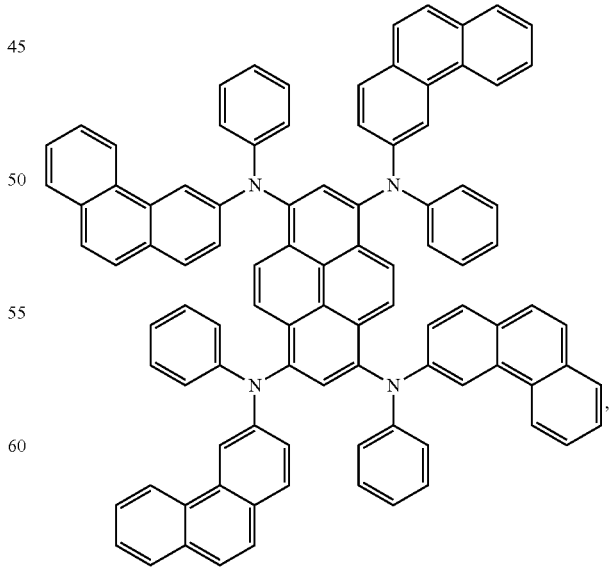

,

CH-04
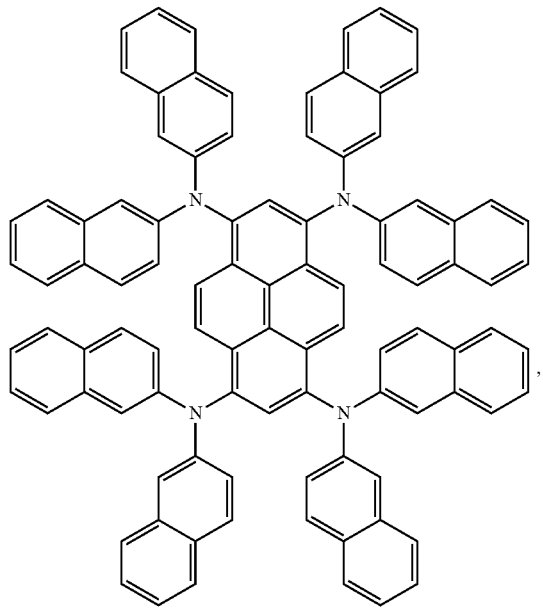
CH-07
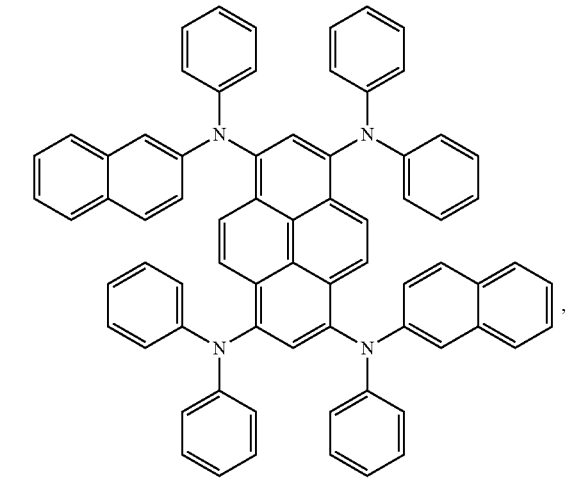
,
CH-06
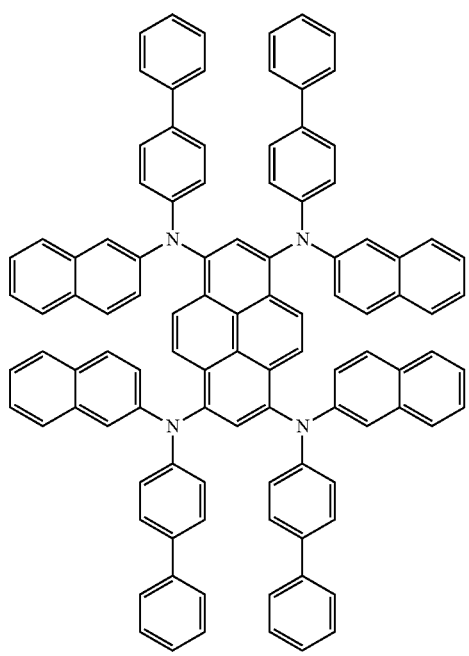
CH-08
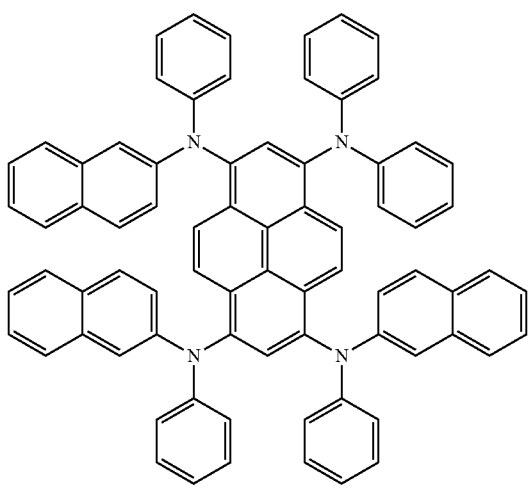
and

CH-24

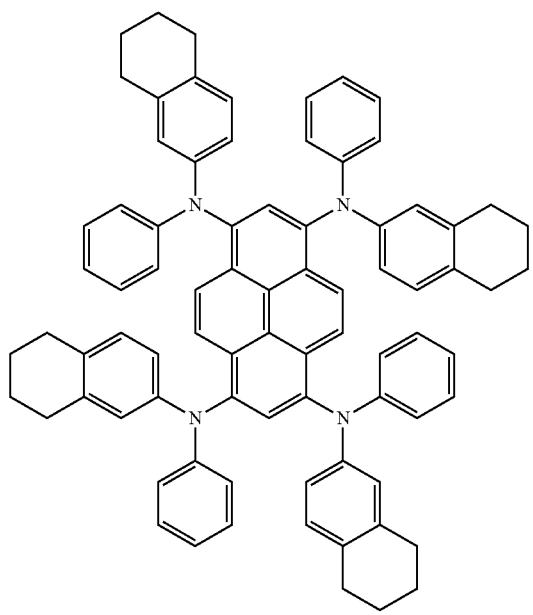

CH-11

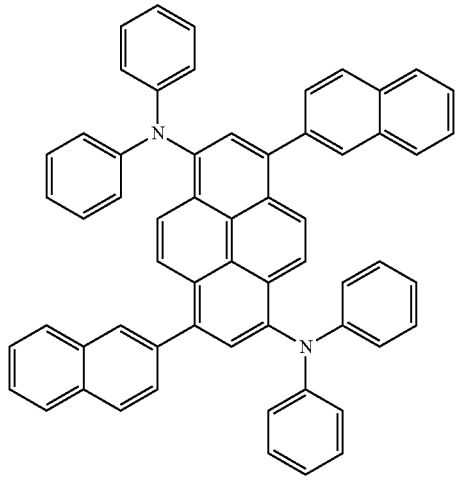

14. The organic light emitting device according to claim 13, wherein R1 to R4, R9 and R10 are independently selected from an aromatic group substituted by an alkyl group or a halogen.

15. The organic light emitting device according to claim 14, wherein the alkyl group has 1 to 6 carbon atoms.

16. The organic light emitting device according to claim 14, wherein the halogen is F, Cl, Br or I.

17. The organic light emitting device according to claim 13, wherein the at least one compound of Formula 2 and Formula 3 is selected from the group consisting of:

CH-12

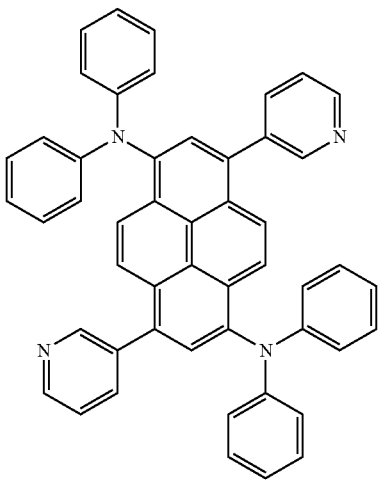

CH-10

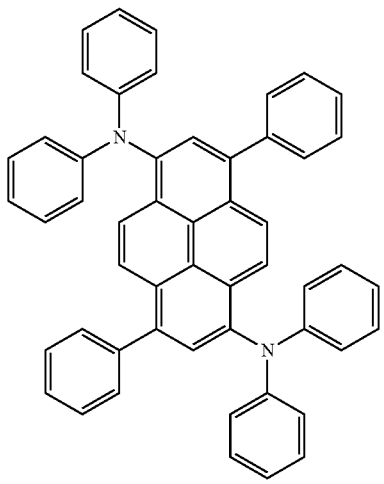

CH-13

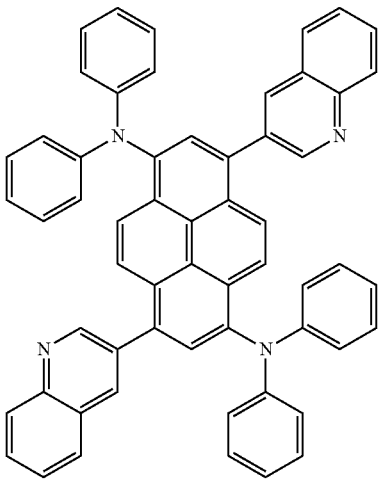

CH-14
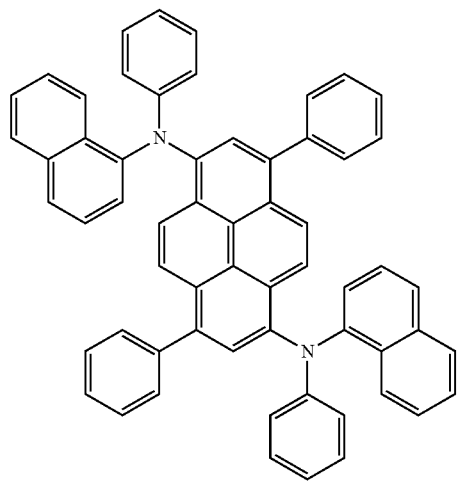
CH-15
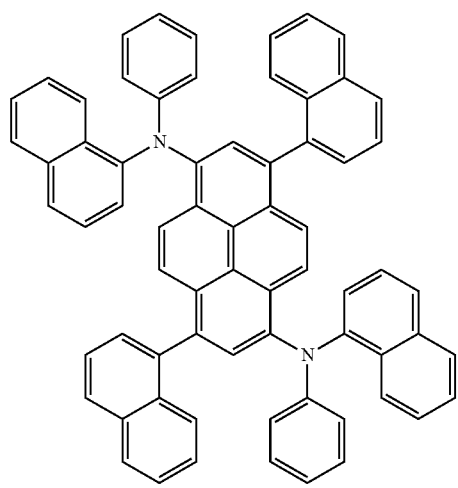
CH-16
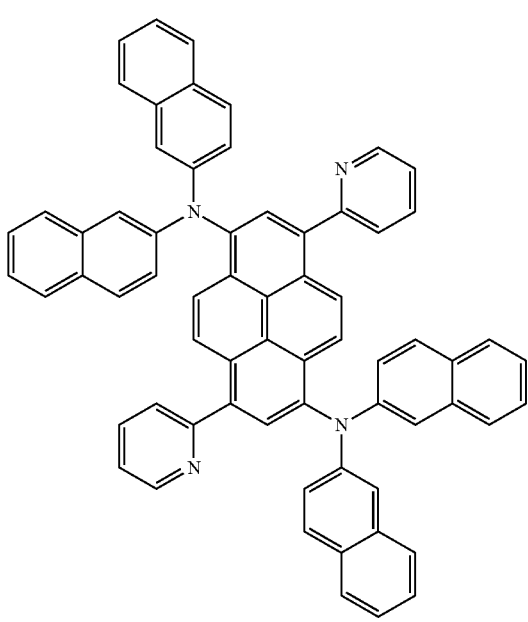
CH-17
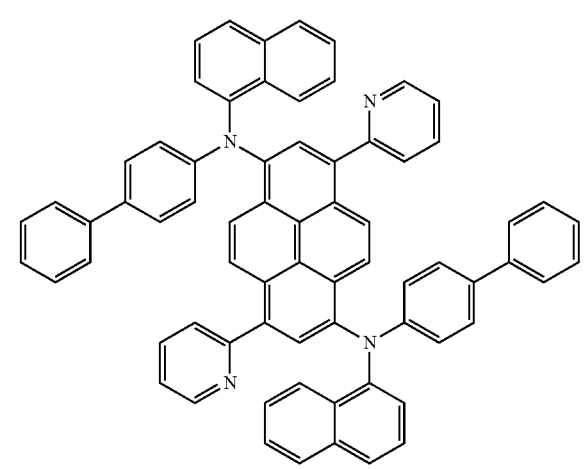
CH-18
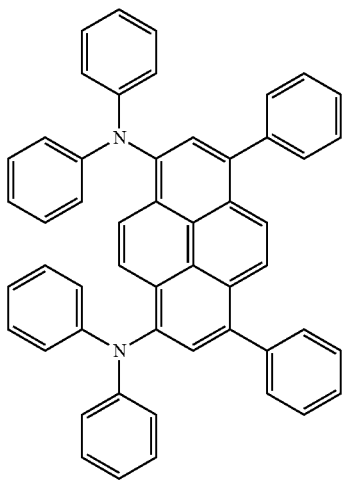
CH-19
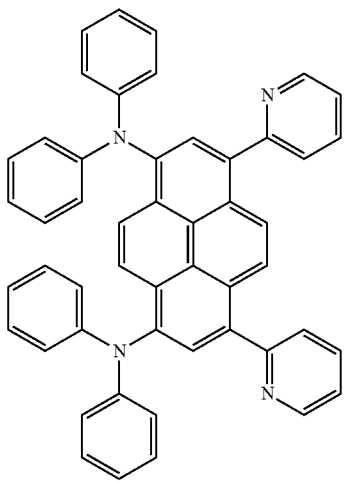

CH-20
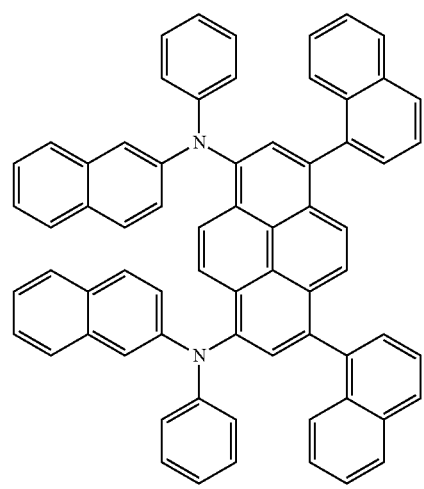
CH-21
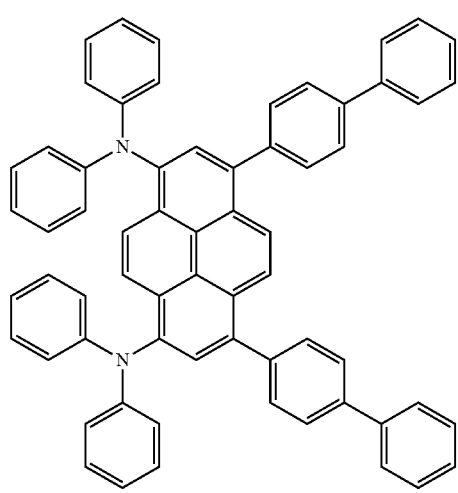
CH-25
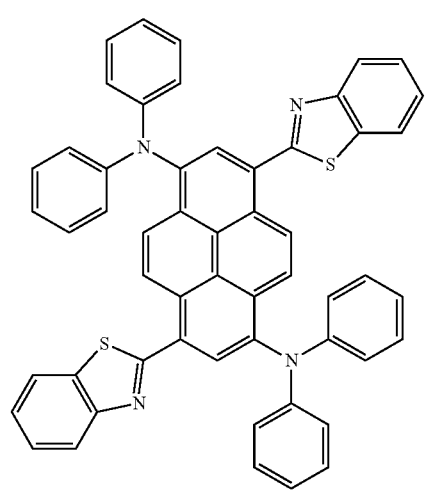
CH-26
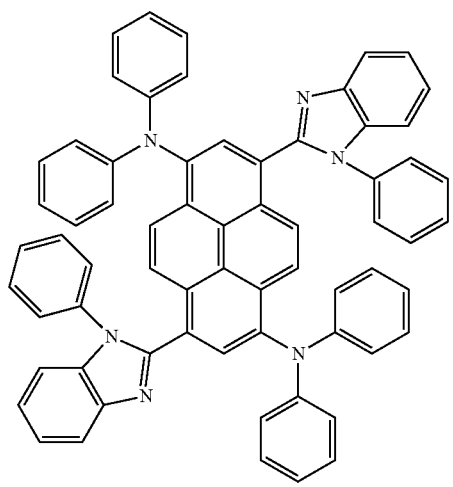
CH-27
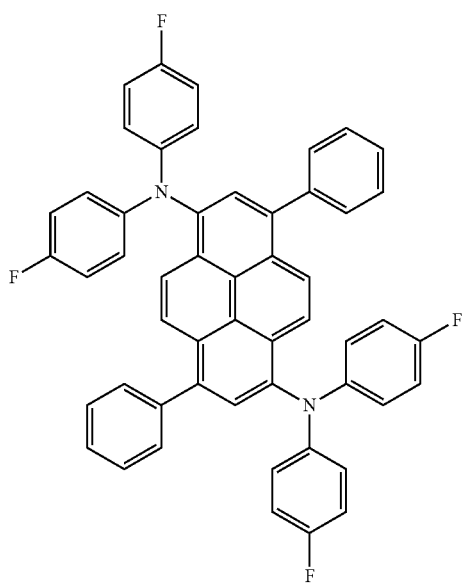
CH-28
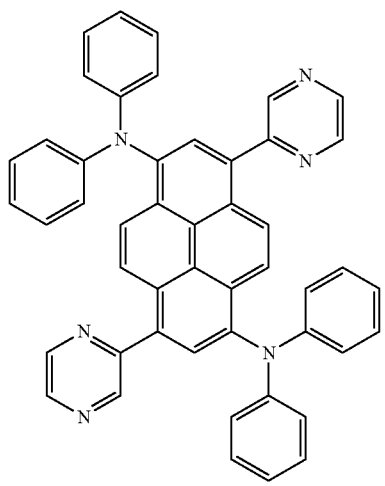

CH-29
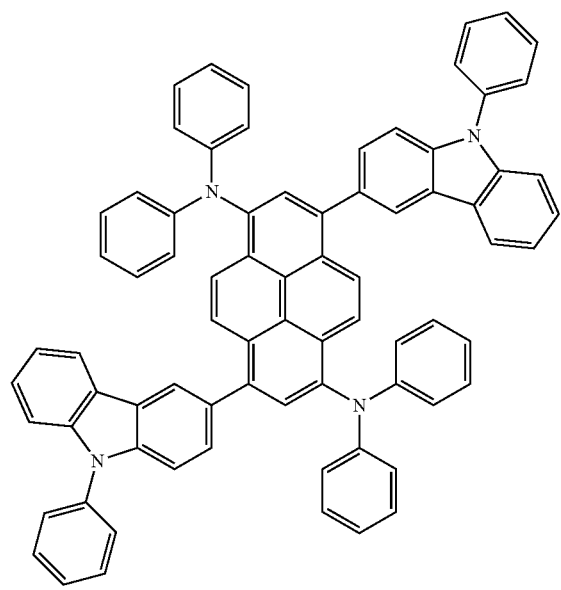
CH-30
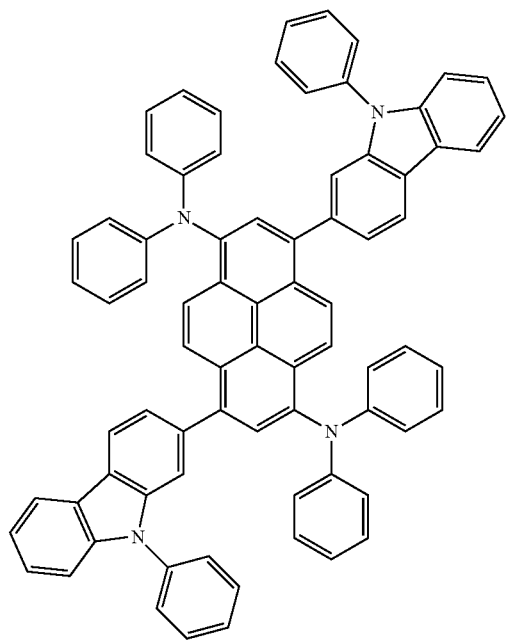
CH-31
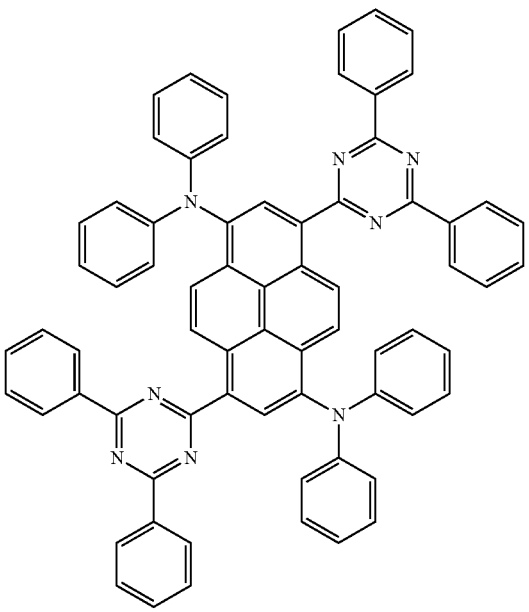
CH-32
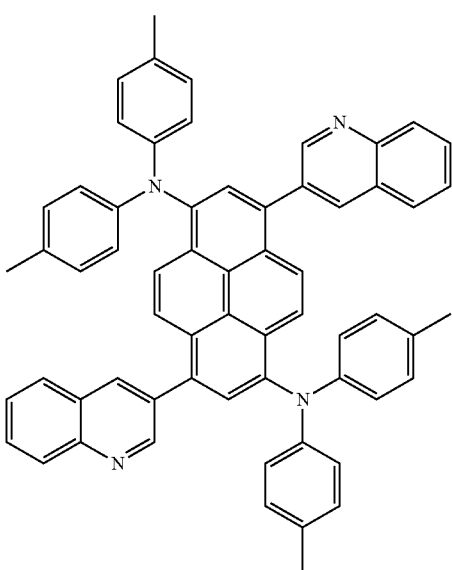

CH-33
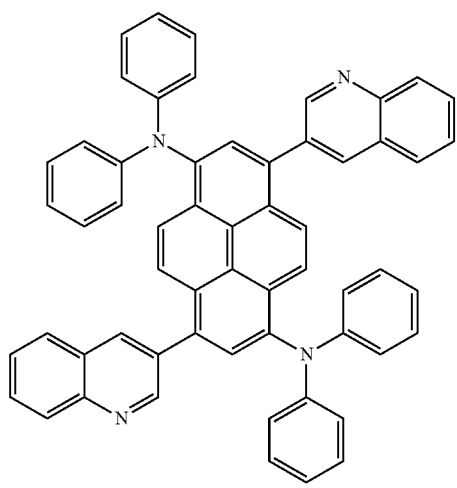
CH-34
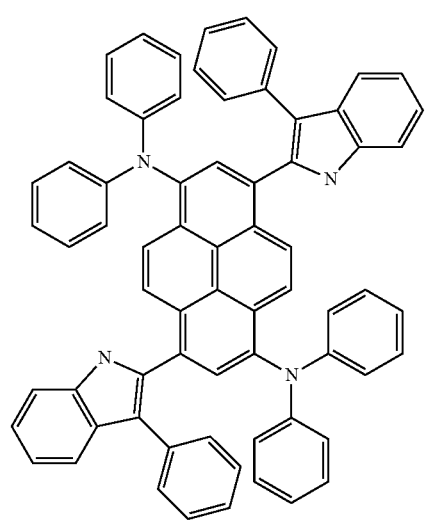
CH-35
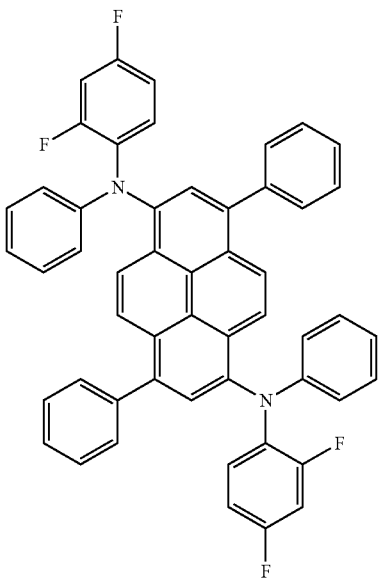
CH-36
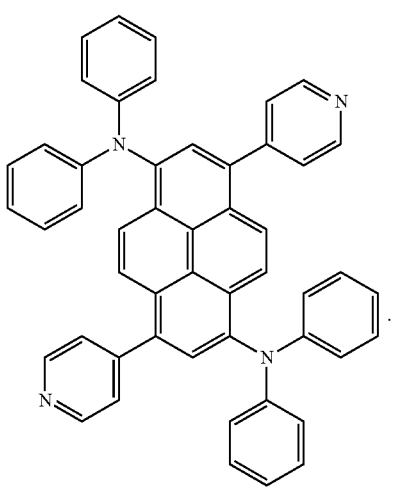
* * * * *